(12) United States Patent
Takiguchi et al.

(10) Patent No.: US 10,840,079 B2
(45) Date of Patent: Nov. 17, 2020

(54) SUBSTRATE PROCESSING APPARATUS, SUBSTRATE PROCESSING METHOD AND STORAGE MEDIUM

(71) Applicant: TOKYO ELECTRON LIMITED, Tokyo (JP)

(72) Inventors: Yasushi Takiguchi, Kumamoto (JP); Taro Yamamoto, Kumamoto (JP); Yoshiki Okamoto, Kumamoto (JP); Hayato Hosaka, Kumamoto (JP); Teruhiko Kodama, Kumamoto (JP); Akihiro Kubo, Kumamoto (JP); Ryuto Ozasa, Kumamoto (JP); Yuji Ariuchi, Kumamoto (JP); Shinsuke Kimura, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 417 days.

(21) Appl. No.: 15/824,274

(22) Filed: Nov. 28, 2017

(65) Prior Publication Data

US 2018/0151343 A1 May 31, 2018

(30) Foreign Application Priority Data

Nov. 29, 2016 (JP) .................................. 2016-231474
Oct. 10, 2017 (JP) .................................. 2017-197032

(51) Int. Cl.
*B24B 37/04* (2012.01)
*B24B 37/10* (2012.01)
(Continued)

(52) U.S. Cl.
CPC ...... *H01L 21/02016* (2013.01); *B24B 37/042* (2013.01); *B24B 37/10* (2013.01);
(Continued)

(58) Field of Classification Search
CPC ....... B24B 37/04; B24B 37/042; B24B 37/07; B24B 37/10; B24B 37/30; B24B 41/06;
(Continued)

(56) References Cited

U.S. PATENT DOCUMENTS 5,361,449 A * 11/1994 Akimoto ................... B08B 1/04
15/302
8,545,119 B2 * 10/2013 Ookouchi ......... H01L 21/67051
15/97.1
(Continued)

FOREIGN PATENT DOCUMENTS

JP 5904169 A 2/2015
JP 2015181145 A 10/2015

*Primary Examiner* — Eileen P Morgan
(74) *Attorney, Agent, or Firm* — Nath, Goldberg & Meyer; Jerald L. Meyer

(57) ABSTRACT

A substrate processing apparatus includes: a first holding part configured to hold a substrate; a second holding part configured to hold the substrate; a sliding member configured to rotate about a vertical axis so that the sliding member slides on a back surface of the substrate; a revolution mechanism configured to revolve the sliding member under rotation about a vertical revolution axis; and a relative movement mechanism configured to horizontally move a relative position between the substrate and a revolution trajectory of the sliding member so that when the substrate is held by the first holding part, the sliding member slides on a central portion of the back surface of the substrate, and when the substrate is held by the second holding part, the sliding member slides on the peripheral portion of the back surface of the substrate under rotation.

17 Claims, 34 Drawing Sheets

(51) Int. Cl.
  *B24B 41/06* (2012.01)
  *H01L 21/02* (2006.01)
  *H01L 21/687* (2006.01)
  *H01L 21/67* (2006.01)
  *H01L 21/683* (2006.01)
  *G03F 7/20* (2006.01)

(52) U.S. Cl.
  CPC ........ *B24B 41/061* (2013.01); *G03F 7/70691* (2013.01); *H01L 21/0209* (2013.01); *H01L 21/02013* (2013.01); *H01L 21/67046* (2013.01); *H01L 21/67219* (2013.01); *H01L 21/67225* (2013.01); *H01L 21/67288* (2013.01); *H01L 21/6838* (2013.01); *H01L 21/6875* (2013.01); *H01L 21/68742* (2013.01); *H01L 21/68764* (2013.01); *H01L 21/68792* (2013.01)

(58) Field of Classification Search
  CPC ................ B24B 41/061; B24B 41/067; H01L 21/02013; H01L 21/6838; H01L 21/6875; H01L 21/68764
  USPC .............................. 451/41, 57, 285, 287, 289
  See application file for complete search history.

(56) References Cited

U.S. PATENT DOCUMENTS

| | | | | |
|---|---|---|---|---|
| 8,578,953 | B2 * | 11/2013 | Takiguchi | H01L 21/67028 134/149 |
| 9,808,903 | B2 * | 11/2017 | Ishii | B24B 21/004 |
| 9,947,556 | B2 * | 4/2018 | Takiguchi | H01L 21/68792 |
| 10,515,833 | B2 * | 12/2019 | Tseng | H01L 21/67253 |
| 2008/0163899 | A1 * | 7/2008 | Takiguchi | H01L 21/67051 134/30 |
| 2012/0014689 | A1 * | 1/2012 | Ookouchi | H01L 21/67051 396/611 |
| 2014/0220866 | A1 * | 8/2014 | Ishii | B24B 7/228 451/41 |
| 2015/0235858 | A1 * | 8/2015 | Lee | H01L 22/12 438/5 |
| 2017/0221696 | A1 * | 8/2017 | Nishiyama | H01L 21/67046 |

* cited by examiner

SUBSTRATE PROCESSING APPARATUS, SUBSTRATE PROCESSING METHOD AND STORAGE MEDIUM

CROSS-REFERENCE TO RELATED APPLICATION(S)

This application is based upon and claims the benefit of priority from Japanese Patent Application Nos. 2016-231474 and 2017-197032, filed on Nov. 29, 2016 and Oct. 10, 2017, respectively, and the entire contents of which are incorporated herein by reference.

TECHNICAL FIELD

The present disclosure relates to a technique in which a sliding member is slid on the back surface of a substrate to perform processing.

BACKGROUND

A semiconductor device has a multilayer wiring structure. In order to form the multilayer wiring structure, in a manufacturing process of a semiconductor device, a photolithography process for forming a resist pattern which is a mask pattern for forming wirings is performed multiple times on a semiconductor wafer (hereinafter referred to as a wafer) which is a substrate. In each photolithography process, exposure processing is carried out so that shots are performed on the same region of the wafer. As the miniaturization of a wiring pattern of the semiconductor device is advanced, it is required to increase the accuracy of alignment, namely the accuracy of overlay (superimposition), between a region where a shot is performed in a previous photolithography process and a region where a shot is performed in a later photolithography process.

Incidentally, during the exposure processing, the wafer is mounted on a stage provided in an exposure machine and is subjected to an exposure shot. On the stage, the wafer is sucked toward the front surface of the stage, whereby the position of the wafer is fixed. However, the wafer to be transferred to the exposure machine may not be flat and may be distorted in some cases. When such a wafer is mounted on the stage, there may be a case where the wafer is sucked by the stage in a distorted state and is subjected to an exposure shot. In this case, a shot is performed in a region that deviates from a region where an original shot is to be performed. Therefore, there is a limit to increasing the accuracy of the overlay.

In the related art, a surface roughening process for polishing the back surface of a wafer is performed in order to solve the problem of a mounting state due to the distortion of the wafer, thereby improving the slipperiness of the back surface of the wafer with respect to the stage of the exposure machine. In a polishing apparatus for performing the surface roughening process, when processing the central portion of the back surface of the wafer, the peripheral portion of the wafer is held by a holding part and a polishing member rotating about its own axis is horizontally moved. When processing the peripheral portion of the back surface of the wafer, the central portion of the wafer is held by a spin chuck and the polishing member rotating about its own axis is moved in the lateral direction while rotating the wafer. In addition, there is known a polishing apparatus in which a polishing member is rotated about its own axis and is revolved so as to have a relatively long revolution radius substantially equal to the size of the radius of the wafer. In this polishing apparatus, when processing the central portion of the back surface of the wafer, the peripheral portion of the wafer is held by a holding part and the wafer is horizontally moved while rotating and revolving the polishing member. When processing the peripheral portion of the back surface of the wafer, the wafer is rotated by a spin chuck holding the central portion of the wafer while rotating and revolving the polishing member.

In order to mount the wafer on the stage of the exposure machine in a flat state, it is preferable that polishing is carried out so that minute protrusions are uniformly formed in the respective in-plane portions on the back surface of the wafer, thereby enhancing the slipperiness of the respective portions of the wafer with respect to the stage. In the apparatuses referred to above, the movement pattern of the polishing member with respect to the wafer is different between the time when the polishing member is positioned in the central portion of the wafer and the time when the polishing member is positioned in the peripheral portion of the wafer. Therefore, the shape of a groove is different in the respective in-plane portions. In the former polishing apparatus, the central portion of the wafer is polished only by the rotation of the polishing member. In the latter polishing apparatus, the revolution radius of the polishing member is relatively large. It is therefore difficult to form sufficiently fine protrusions. Accordingly, there is a demand for an apparatus capable of performing polishing so as to form finer protrusions with higher uniformity on the back surface of a wafer.

SUMMARY

Some embodiments of the present disclosure provide a technique capable of performing, with high in-plane uniformity, a process to be performed by a sliding member sliding on the backside of a substrate and capable of reliably applying a sliding action of the sliding member to the substrate.

According to one embodiment of the present disclosure, there is provided a substrate processing apparatus, including: a first holding part configured to horizontally hold a region not overlapping with a central portion of a back surface of a substrate; a second holding part configured to horizontally hold the central portion of the back surface of the substrate and to rotate the substrate about a vertical axis; a sliding member configured to rotate about a vertical axis so that the sliding member slides on the back surface of the substrate to perform processing; a revolution mechanism configured to revolve the sliding member under rotation about a vertical revolution axis so as to have a revolution radius smaller than a diameter of the sliding member; and a relative movement mechanism configured to horizontally move a relative position between the substrate and a revolution trajectory of the sliding member so that when the substrate is held by the first holding part, the sliding member slides on the central portion of the back surface of the substrate, and when the substrate is held by the second holding part, the sliding member slides on a peripheral portion of the back surface of the substrate under rotation.

According to another embodiment of the present disclosure, there is provided a substrate processing method, including: horizontally holding, by a first holding part, a region not overlapping with a central portion of a back surface of a substrate; horizontally holding, by a second holding part, the central portion of the back surface of the substrate and rotating the substrate about a vertical axis; rotating a sliding member, which is configured to perform processing by sliding on the back surface of the substrate, about a vertical axis; revolving, by a revolution mechanism, the sliding member under rotation around a vertical revolution axis so as to have a revolution radius smaller than a diameter of the sliding member; horizontally moving, by a relative movement mechanism, a relative position between the substrate and a revolution trajectory of the sliding member; revolving the sliding member under rotation so as to slide on the central portion of the back surface of the substrate when the substrate is held by the first holding part; and revolving the sliding member so as to slide on a peripheral portion of the back surface of the substrate when the substrate is held by the second holding part According to another embodiment of the present disclosure, there is provided a non-transitory computer-readable storage medium storing a program used for a substrate processing apparatus in which a sliding member slides on a back surface of a substrate to perform processing, herein the program incorporates steps for executing the substrate processing method of the present disclosure.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
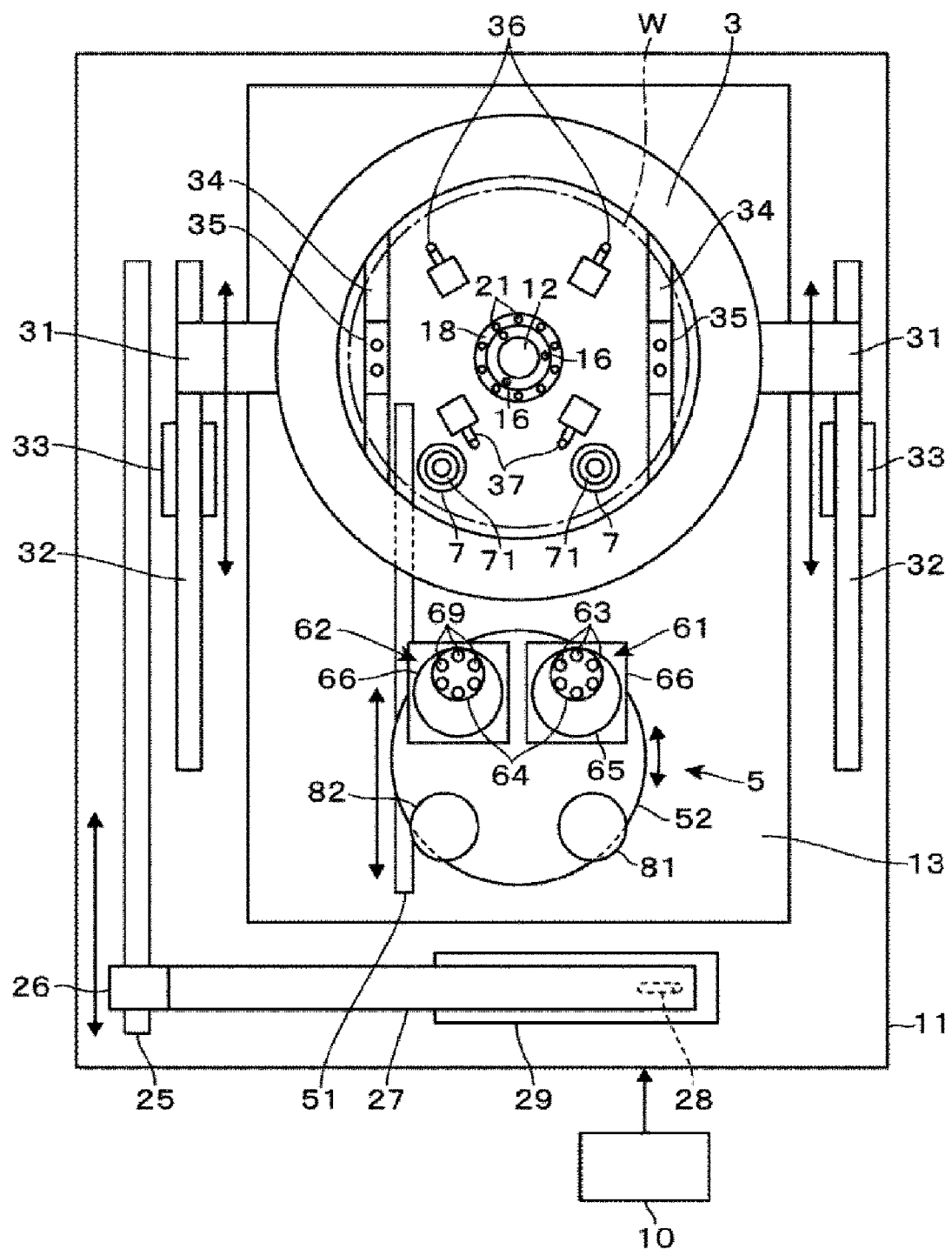
FIG. 1 is a plan view of a polishing apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A polishing apparatus 1 as an embodiment of a substrate processing apparatus of the present disclosure will be described with reference to a plan view and a vertical sectional side view of FIGS. 1 and 2. In the polishing apparatus 1, the back surface of a wafer W which is a circular substrate is polished and roughened by grindstones. As will be described in detail later, this polishing process is carried out to reduce the contact area of the back surface of the wafer W with a stage when the wafer W is mounted on the stage provided in an exposure machine that exposes a resist film on the front surface of the wafer W after the processing performed by the polishing apparatus 1. In addition, the polishing apparatus 1 performs a cleaning process of supplying a cleaning solution to the region subjected to the polishing process and rubbing the region with brushes to remove a foreign material generated by the polishing process.

The polishing apparatus 1 includes a base body 11, a spin chuck 12, a cup 3, a polishing/cleaning processing part 5, a cyclone pad 7, a grindstone cleaning part 81, a brush cleaning part 82, and various kinds of nozzles for supplying pure water as a cleaning solution. The base body 11 is formed in a rectangular shape in a plan view. The wafer W is transferred from the one end side in the longitudinal direction of the base body 11 to the polishing apparatus 1 by a transfer mechanism (not shown) provided outside the polishing apparatus 1. This one end side will be described as a front side. The base body 11 is provided with a rectangular recess 13 whose front-rear direction is the longitudinal direction. The inside of the recess 13 is configured as a processing region of the wafer W. The spin chuck 12 is provided on the front side of this processing region.

The spin chuck 12 attracts the central portion of the back surface of the wafer W and holds the wafer W horizontally. The lower side of the spin chuck 12 is connected to a rotating mechanism 15 via a shaft 14. The rotating mechanism 15 rotates the spin chuck 12 so that the wafer W held by the spin chuck 12 rotates about a vertical axis. In a processing example of the wafer W, which will be described later, the wafer W is rotated clockwise in a plan view by the spin chuck 12. However, the wafer W may be rotated in the opposite direction. On the lateral side of the spin chuck 12, three vertical support pins 16 are disposed in a spaced-apart relationship in the rotation direction of the spin chuck 12. In FIG. 2, only two support pins 16 are shown. The support pins 16 are configured to be movable up and down by an elevating mechanism 17. The support pins 16 are capable of delivering the wafer W between the above-described transfer mechanism and the spin chuck 12 as a second holding part and a fixed chuck 35 as a first holding part.

A cylindrical portion extending upward from the bottom portion of the base body 11 is provided so as to surround the spin chuck 12, the rotating mechanism 15, the support pins 16 and the elevating mechanism 17, and is configured as an air knife 18. The upper end surface of the air knife 18 forms a slant surface inclined inward. Discharge ports 21 for discharging, e.g., air upward are provided on the slant surface at intervals in the circumferential direction. When the back surface of the wafer W is attracted and held by the spin chuck 12, the upper end of the air knife 18 is close to the back surface of the wafer W. As an air is discharged from the discharge ports 21, the cleaning solution is prevented from adhering to the central portion of the back surface of the wafer W. Before the wafer W is held on the spin chuck 12, the air is discharged in order to dry the central portion of the back surface of the wafer W.

A drain port 22 for removing a waste liquid dropped from the wafer W into the recess 13 is provided at the bottom of the recess 13 of the base body 11. An upright exhaust pipe 23 for exhausting the inside of the recess 13 is provided at a position closer to the air knife 18 than the drain port 22. During the processing of the wafer W, the exhaust from the exhaust pipe 23 is performed, whereby the cleaning solution scattered from the wafer W and the shavings of the wafer W generated by polishing are prevented from scattering to the outside of the recess 13. In FIG. 2, reference numeral 24 denotes a flange extending outward from the air knife 18. The outer end portion of the flange 24 is bent downward outside the exhaust pipe 23 and is located below the upper end of the exhaust pipe 23 to prevent the waste liquid from flowing into the exhaust pipe 23.

The cup 3 is formed in a cylindrical shape with its upper end portion protruding inward so as to surround the air knife 18. This cup 3 surrounds the wafer W during the processing and suppresses scattering of the waste liquid from the wafer W. Support portions 31 extend from the left and right outer walls of the cup 3 toward the outer edge of the recess 13 and are connected to a horizontal movement mechanism 32 provided on the base body 11. The cup 3 can be moved in the front-rear direction within the recess 13 by the horizontal movement mechanism 32. In addition, an elevating mechanism 33 is provided below the horizontal movement mechanism 32. The horizontal movement mechanism 32 can be raised and lowered by the elevating mechanism 33. In other words, the cup 3 can move up and down.

The cup 3 is provided with two bridge portions 34 that sandwich the spin chuck 12 from the left and right sides and extend in the front-rear direction. The fixed chuck 35 is provided in the bridge portions 34. The fixed chuck 35 attracts the outer region of the central portion of the back surface of the wafer W and holds the wafer W horizontally. The wafer W is held on the fixed chuck 35 when processing the central portion of the back surface of the wafer W and is held on the spin chuck 12 when processing the outer region of the central portion of the back surface of the wafer W.

Figure 2:
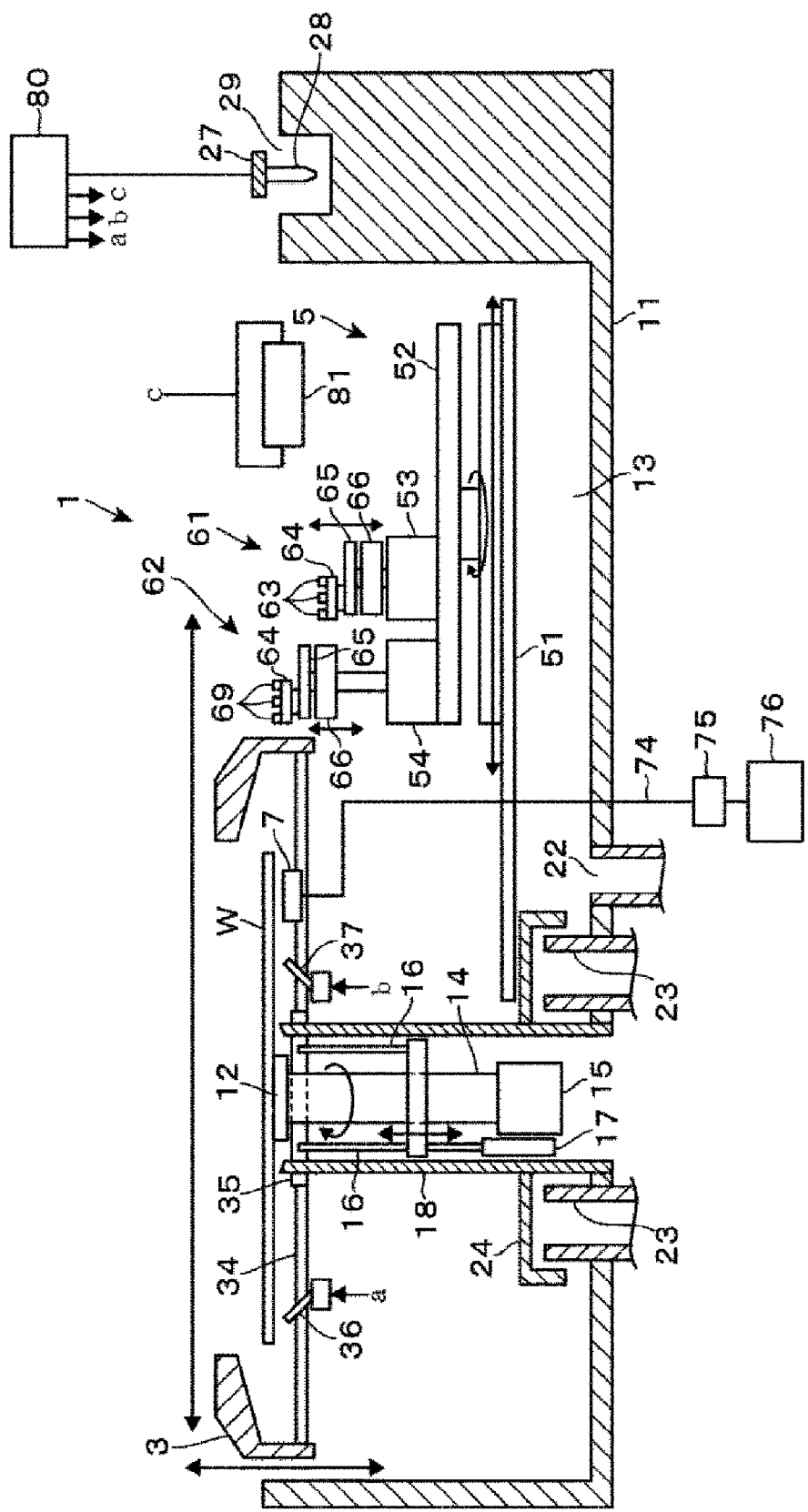
FIG. 2 is a vertical sectional side view of the polishing apparatus.

In FIGS. 1 and 2, reference numeral 36 denotes peripheral portion cleaning nozzles that discharge pure water obliquely upward toward the peripheral portion of the back surface of the wafer W when the wafer W is held by the spin chuck 12. Reference numeral 37 in FIGS. 1 and 2 denotes back surface cleaning nozzles that discharge pure water obliquely backward and upward. When processing the central portion of the back surface of the wafer W, the wafer W is held by the fixed chuck 35 at a position where the pure water discharged from the back surface cleaning nozzles 37 is supplied to the central portion of the back surface of the wafer W. When the wafer W is held by the spin chuck 12, the back surface cleaning nozzles 37 are provided so as to discharge the pure water to the outer region of the central portion of the back surface of the wafer W.

When looking from the back side toward the front side, a lifting mechanism 26 that moves in the front-rear direction by a moving mechanism 25 is provided on the left side of the recess 13 in the base body 11. An arm 27 capable of being moved up and down by the lifting mechanism 26 extends rightward from the lifting mechanism 26. A front surface cleaning nozzle 28 for discharging pure water obliquely leftward and downward is provided in the tip portion of the arm 27 so that pure water can be discharged to the central portion of the front surface of the wafer W held by the spin chuck 12. A concave portion 29 forming a standby portion of the front surface cleaning nozzle 28 is provided on the back side of the recess 13. The front surface cleaning nozzle 28 is moved by the moving mechanism 25 and the lifting mechanism 26 between the inside of the concave portion 29 and the position where pure water is discharged to the wafer W.

Next, the polishing/cleaning processing part 5 will be described. The polishing/cleaning processing part 5 includes a horizontal movement mechanism 51, a rotating mechanism 52, lifting mechanisms 53 and 54, a polishing mechanism 61, and a cleaning mechanism 62. The horizontal movement mechanism 51 is provided so as to extend in the front-rear direction within the recess 13. The rotating mechanism 52 can be moved in the front-rear direction by the horizontal movement mechanism 51 from the rear end portion in the recess 13 to the front of the air knife 18. Further, the upper side of the rotating mechanism 52 is configured as a horizontal circular stage. The stage can rotate about its vertical center axis. On the stage of the rotating mechanism 52, the lifting mechanisms 53 and 54 are provided in a spaced-apart relationship in the circumferential direction. The polishing mechanism 61 is provided on the lifting mechanism 53 so as to be moved up and down by the lifting mechanism 53. The cleaning mechanism 62 is provided on the lifting mechanism 54 so as to be moved up and down by the lifting mechanism 54. By the cooperation of the up/down movement by the lifting mechanisms 53 and 54, the horizontal movement by the horizontal movement mechanism 51 and the rotation by the rotating mechanism 52, the polishing mechanism 61 and the cleaning mechanism 62 can be moved between the inside of the cup 3 and the outside of the cup 3. The horizontal movement mechanism 51 and the horizontal movement mechanism 32, to which the cup 3 is connected, constitute a relative movement mechanism for changing the relative position in the horizontal direction of the polishing mechanism 61 and the cleaning mechanism 62 with respect to the wafer W.

The polishing mechanism 61 and the cleaning mechanism 62 are configured substantially in the same manner. As a representative, the polishing mechanism 61 will now be described with reference to the vertical sectional side view of FIG. 3. The polishing mechanism 61 includes grindstones 63, a support plate 64, a revolution plate 65, and a drive unit 66 which is a revolution mechanism. The support plate 64 is a horizontal circular plate. For example, on the peripheral edge portion of the support plate 64, six grindstones 63 are arranged at equal intervals along the circumferential direction of the support plate 64 (see FIG. 1). The grindstones 63 are, for example, diamond grindstones having a grain size of 60,000 and are formed in a horizontal disc shape. The grindstones 63 rub the back surface of the wafer W to roughen the back surface of the wafer W. A vertical first rotation shaft 601 is provided at the center of the back surface of the support plate 64.

Figure 3:
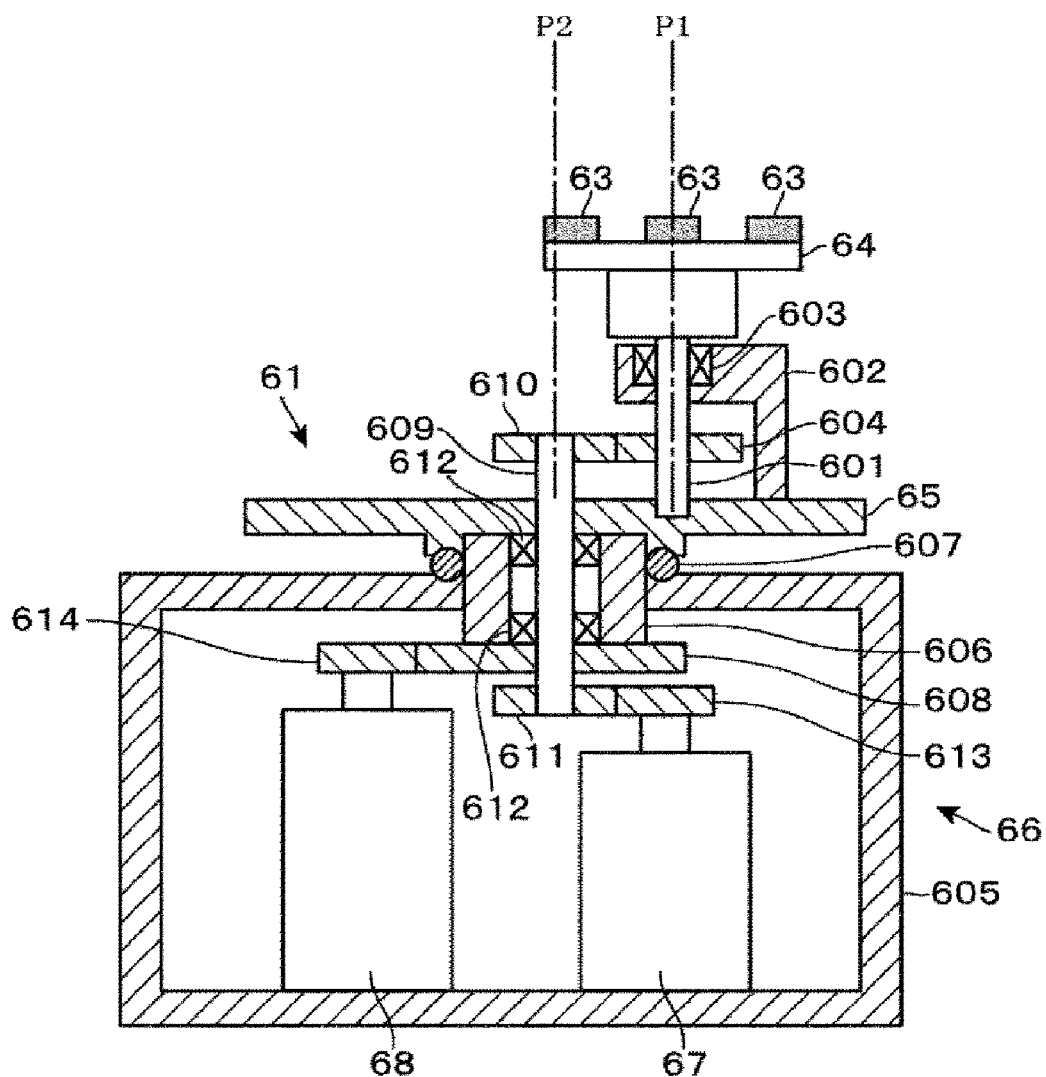
FIG. 3 is a vertical sectional side view of a polishing mechanism provided in the polishing apparatus.

The revolution plate 65 is horizontally provided below the support plate 64. The revolution plate 65 is formed in a disc shape. The first rotation shaft 601 is supported on the revolution plate 65 by a support portion 602 provided in the revolution plate 65. The support portion 602 includes a bearing 603 for supporting the first rotation shaft 601 so as to be rotatable around a vertical axis indicated by P1 in FIG. 3. In FIG. 3, reference numeral 604 denotes a gear provided on the first rotation shaft 601 and configured to rotate about the axis P1 as a rotation axis.

A box 605 constituting the drive unit 66 is provided below the revolution plate 65. A vertical revolution cylinder 606 extends from the central portion of the revolution plate 65 toward the interior of the box 605. The revolution plate 65 is supported by a bearing 607 with respect to the box 605 so as to be rotatable about a vertical axis indicated by P2 in FIG. 3. The lower end portion of the revolution cylinder 606 is provided inside the box 605 and is configured as a gear 608 that rotates about the axis P2 as a rotation axis.

Furthermore, there is provided a vertical second rotation shaft 609 penetrating the revolution cylinder 606. The upper end portion of the second rotation shaft 609 is configured as a gear 610 that meshes with the gear 604 of the first rotation shaft 601. The lower end portion of the second rotation shaft 609 is configured as a gear 611. The second rotation shaft 609 and the gears 610 and 611 rotate about the axis P2 as a rotation axis. In FIG. 3, reference numeral 612 denotes a bearing which supports the second rotation shaft 609 so as to be rotatable relative to the revolution cylinder 606.

A rotation motor 67 and a revolution motor 68 constituting the drive unit 66 are provided inside the box 605. The gear 611 of the second rotation shaft 609 meshes with a gear 613 provided in the rotation motor 67, and the gear 608 provided in the revolution cylinder 606 meshes with a gear 614 provided in the revolution motor 68. With such a configuration, the support plate 64 is rotated by the rotation motor 67 and the revolution plate 65 is rotated by the revolution motor 68, whereby the support plate 64 and the revolution plate 65 are rotated independently of each other. Accordingly, the support plate 64 can rotate about the axis P1 and can revolve around the axis P2. Thus, there may be a case where the axis P1 is described as a rotation axis and the axis P2 is described as a revolution axis. In the process example described later, the support plate 64 rotates counterclockwise in a plan view and revolves clockwise in a plan view. However, the direction of rotation and the direction of revolution are not limited to this example. For example, the support plate 64 may rotate and revolve clockwise in a plan view.

Figure 4:
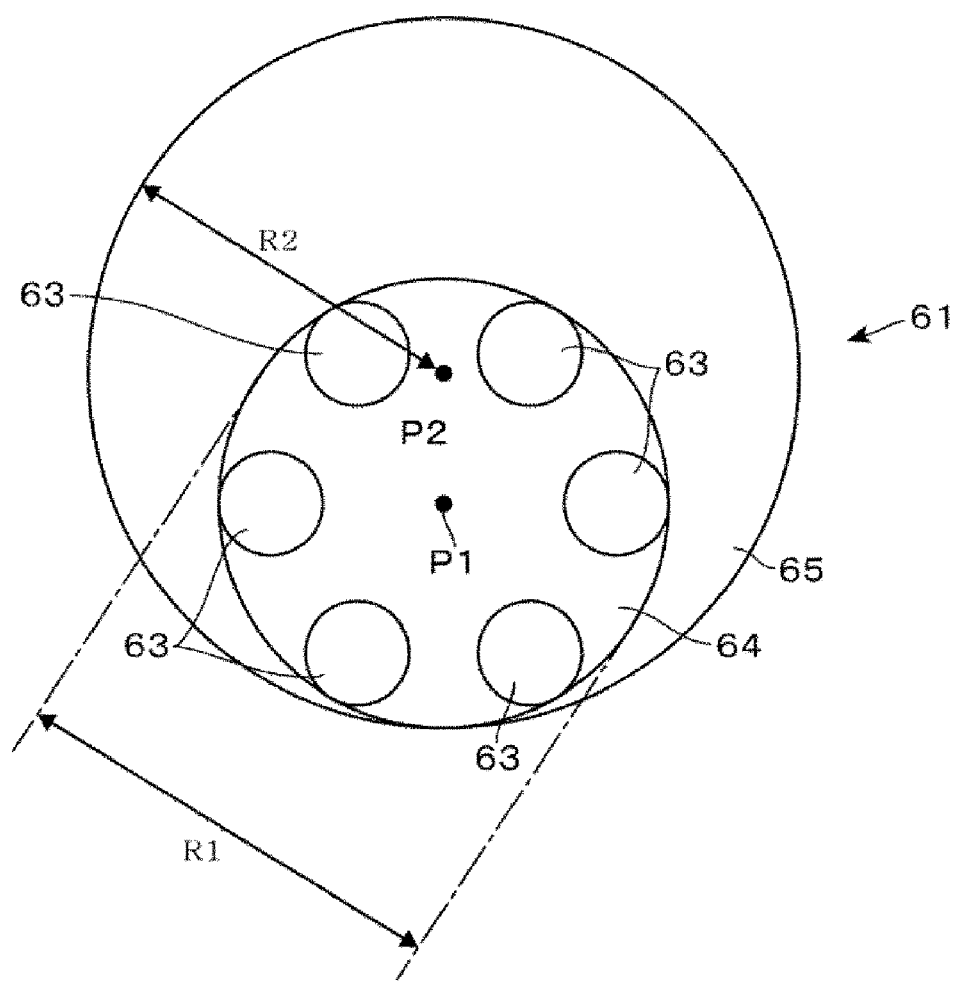
FIG. 4 is a plan view of the polishing mechanism.

FIG. 4 is a top view of the polishing mechanism 61. As shown in FIG. 4, the diameter R1 of the support plate 64 is larger than the revolution radius R2 of the support plate 64. In the polishing process of the back surface of the wafer W, while the grindstones 63 are in contact with the back surface of the wafer W, the support plate 64 rotates about the rotation axis P1 and repeatedly revolves around the revolution axis P2, whereby the grindstones 63 slide against the back surface of the wafer W. In the polishing process of the central portion of the back surface of the wafer W, the wafer W is held in a stationary state by the fixed chuck 35, and the support plate 64 rotates and revolves in the aforementioned manner. By setting R1 and R2 as described above, the grindstones 63 pass through all the regions inside the outer edge of the revolution trajectory of the support plate 64. Therefore, even if the wafer W is kept stationary in this way, it is possible to polish the entire central portion of the back surface of the wafer W by disposing the revolution trajectory of the support plate 64 so as to overlap with the central portion of the back surface of the wafer W.

A difference of the cleaning mechanism 62 from the polishing mechanism 61 resides in that the support plate 64 is provided with circular brushes 69 instead of the grindstones 63. The brushes 69 and the support plate 64 are configured as a cleaning member (see FIGS. 1 and 2). The brushes 69 rub the back surface of the wafer W, thereby removing particles adhering to the back surface of the wafer W, which is generated by the polishing process.

Figure 5:
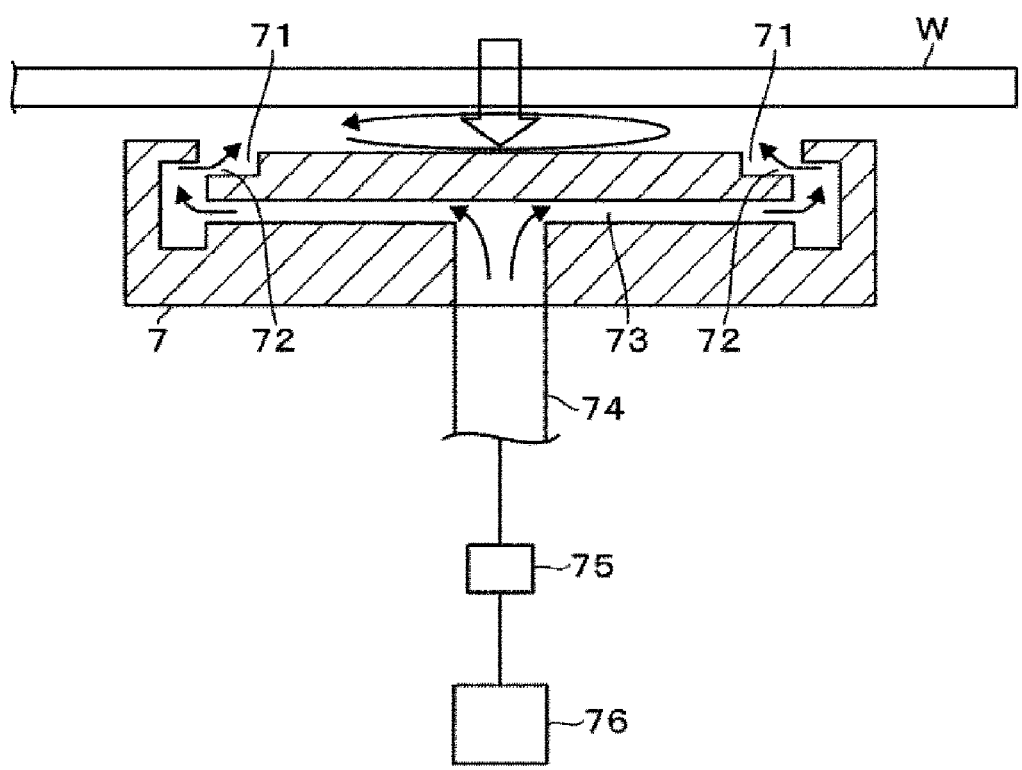
FIG. 5 is a vertical sectional side view of a cyclone pad.

Next, the cyclone pad 7 as a height regulating part of the wafer W will be described. Two cyclone pads 7 are provided and are respectively disposed on the left side and the right side with respect to the air knife 18 in a region surrounded by the cup 3 in a plan view on the rear side of the air knife 18. FIG. 5 shows a vertical sectional side view of the cyclone pad 7. The cyclone pad 7 is formed in a flat, horizontal and substantially circular block shape. When the wafer W is held by the spin chuck 12, the upper surface of the cyclone pad 7 is close to the peripheral portion of the back surface of the wafer W.

On the upper surface of the cyclone pad 7, a circular ring-shaped groove 71 is formed along the circumference of the cyclone pad 7. On the outer side surface forming the groove 71, a plurality of air discharge ports 72 is opened at intervals along the circumferential direction of the groove 71. The discharge ports 72 are connected to a flow path 73 provided in the cyclone pad 7. One end of an air supply pipe 74 is connected to the flow path 73. The other end of the air supply pipe 74 is connected to an air supply source 76 via a flow rate adjustment part 75. The flow rate adjustment part 75 includes a valve and a mass flow controller, and adjusts the flow rate of air supplied to the cyclone pad 7, based on a control signal supplied from a control part 10 described later.

As described above, air is discharged from the discharge ports 72 in a state in which the upper surface of the cyclone pad 7 is close to the peripheral portion of the back surface of the wafer W. The air guided by the groove 71 forms a swirling flow between the cyclone pad 7 and the back surface of the wafer W as indicated by an arrow in FIG. 5. The air flows from the gap formed between the cyclone pad 7 and the wafer W toward the outside of the cyclone pad 7. A negative pressure is generated in the central portion of the swirling flow. The region of the peripheral portion of the wafer W located just above the cyclone pad 7 is sucked toward the cyclone pad 7, namely downward, by the negative pressure. The negative pressure may grow higher as the flow rate of the air discharged from the discharge ports 72 is made larger by the flow rate adjustment part 75. In other words, the cyclone pad 7 is configured to adjust the suction pressure.

The cyclone pad 7 prevents the peripheral portion of the wafer W from being lifted when the grindstones 63 or the brushes 69 are pressed upward against the back surface of the wafer W and slides with respect to the wafer W. That is to say, the cyclone pad 7 regulates the height of the peripheral portion of the wafer W in a non-contact manner with respect to the wafer W, brings the wafer W into close contact with the grindstones 63 and the brushes 69, and generates a sufficient frictional force between the wafer W and the grindstones 63 or the brushes 69, thereby making sure that the polishing process and the cleaning process are reliably performed. When the wafer W mounted on the spin chuck 12 is processed by the revolution of the support plate 64 provided with the grindstones 63 or the brushes 69 as will be described later, the two cyclone pads 7 are respectively disposed so as to be located on the left side and the right side with respect to the revolution trajectory as the revolution trajectory is viewed from the central portion of the wafer W. By disposing the cyclone pads 7 so as to sandwich the revolution trajectory as described above, the height of the peripheral portion of the wafer W is more reliably regulated.

Figure 6:
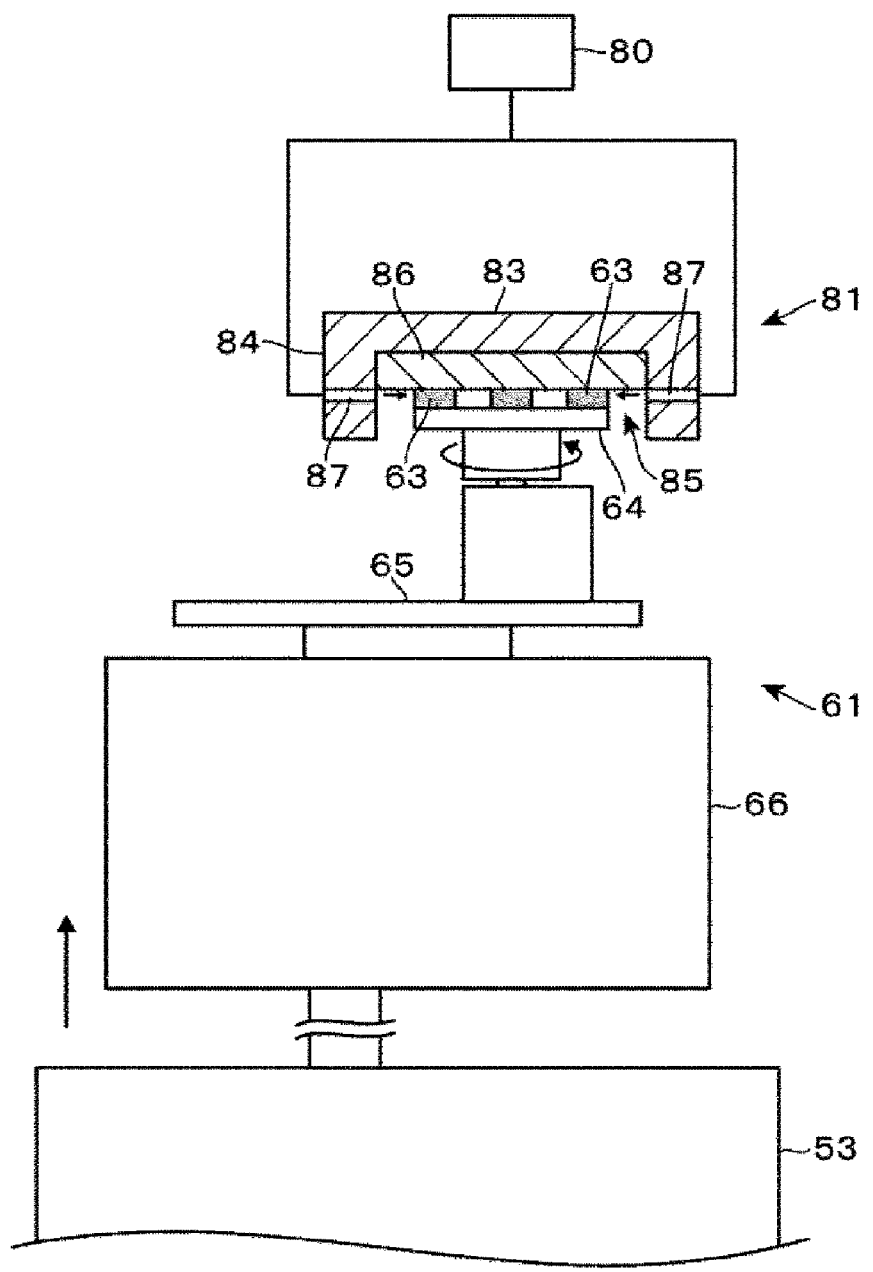
FIG. 6 is a vertical sectional side view of a grindstone cleaning part provided in the polishing apparatus.

As shown in FIGS. 1 and 2, the grindstone cleaning part 81 and the brush cleaning part 82 are provided on the rear side in the recess 13 of the base body 11. The grindstone cleaning part 81 will be described with reference to a vertical sectional side view of FIG. 6. The grindstone cleaning part 81 is provided with a horizontal flat circular portion 83. The peripheral portion of the circular portion 83 forms a protrusion portion 84 protruding downward. The space formed so as to be surrounded by the circular portion 83 and the protrusion portion 84 is configured as an accommodation space 85 that can accommodate the respective grindstones 63 of the polishing mechanism 61 by the operation of the respective parts of the polishing/cleaning processing part 5. The diameter of the accommodation space 85 is set larger than the diameter of the support plate 64 so as to accommodate the grindstones 63 in such a manner. A dresser 86 made of, for example, diamond is provided under the circular portion 83. Discharge ports 87 for discharging pure water to the accommodation space 85 are opened laterally on the inner side wall of the protrusion portion 84. In a state where the grindstones 63 are pressed against the dresser 86 by the lifting mechanism 53, the pure water is discharged from the discharge ports 87 and the support plate 64 is rotated, whereby the dressing of the grindstones 63 is performed. In other words, the shavings clogged in the grindstones 63 are removed and regeneration of the grindstones 63 is performed.

The brush cleaning part 82 is configured in the same manner as the grindstone cleaning part 81, except that the dresser 86 is not provided in the accommodation space 85. The brushes 69 of the cleaning mechanism 62 are accommodated in the accommodation space 85 of the brush cleaning part 82 by the operation of the respective parts of the polishing/cleaning processing part 5. The brushes 69 are cleaned by rotating the support plate 64 of the cleaning mechanism 62 and discharging the pure water toward the accommodation space 85. In FIG. 2, the brush cleaning part 82 is not shown.

The timings for performing the dressing of the grindstones 63 and the cleaning of the brushes 69 may be set in advance. For example, the dressing and the cleaning may be performed each time when a predetermined number of wafers W or a predetermined number of lots of wafers W are processed. In addition, the dressing and the cleaning may be performed at regular intervals, or may be performed at the time designated by a user from the control part 10 described later. Further, when it is determined based on the image data acquired by a back surface imaging module 141 (described later) that the polishing process of the wafer W is not appropriately performed, the dressing of the grindstones 63 may be performed. In other words, it may be determined according to the determination whether or not to perform the dressing.

In FIG. 2, reference numeral 80 denotes a pure water supply source configured to be able to independently supply pure water to the peripheral portion cleaning nozzles 36, the back surface cleaning nozzles 37, the front surface cleaning nozzle 28, the grindstone cleaning part 81, and the brush cleaning part 82.

The polishing apparatus 1 is provided with a control part 10 configured by a computer. The control part 10 is provided with a program. In order to perform a series of the below-described processing operations with respect to the wafer W, the program incorporates step groups so that control signals can be output to the respective parts of the polishing apparatus 1 so as to control the operations of the respective parts. Specifically, the program controls the rotation number of the spin chuck 12 by the rotating mechanism 15, the movement of the cup 3 by the elevating mechanism 33 and the horizontal movement mechanism 32, the up/down movement of the support pins 16 by the elevating mechanism 17, the operations of the respective parts constituting the polishing/cleaning processing part 5, the amount of air supplied to the cyclone pad 7 by the flow rate adjustment part 75, the supply of pure water to the respective nozzles, the grindstone cleaning part 81, and the brush cleaning part 82 from the pure water supply source 80, and the like. The program is stored in the control part 10 in a state in which the program is stored in a storage medium such as, for example, a hard disk, a compact disk, a magneto-optical disk (MO), a memory card, or the like.

Figure 14:
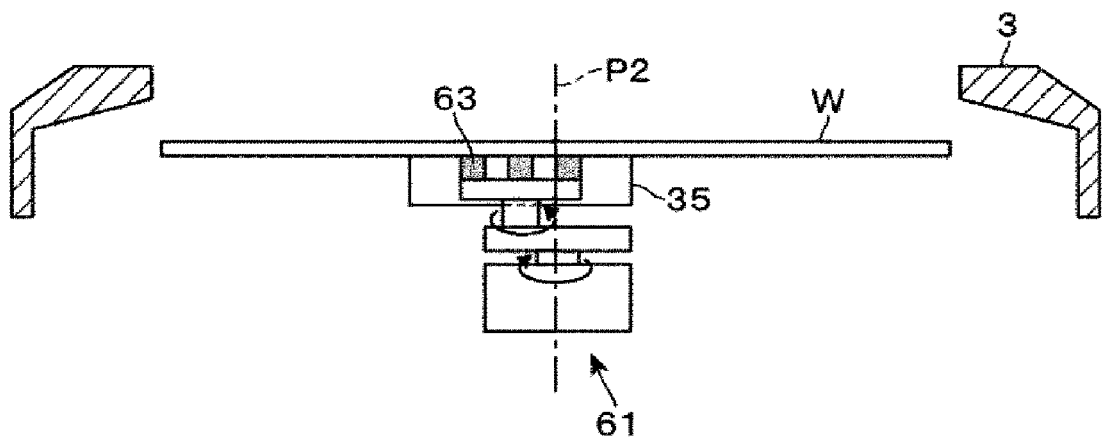
FIG. 14 is a side view of a wafer for showing a wafer processing process.
Figure 15:
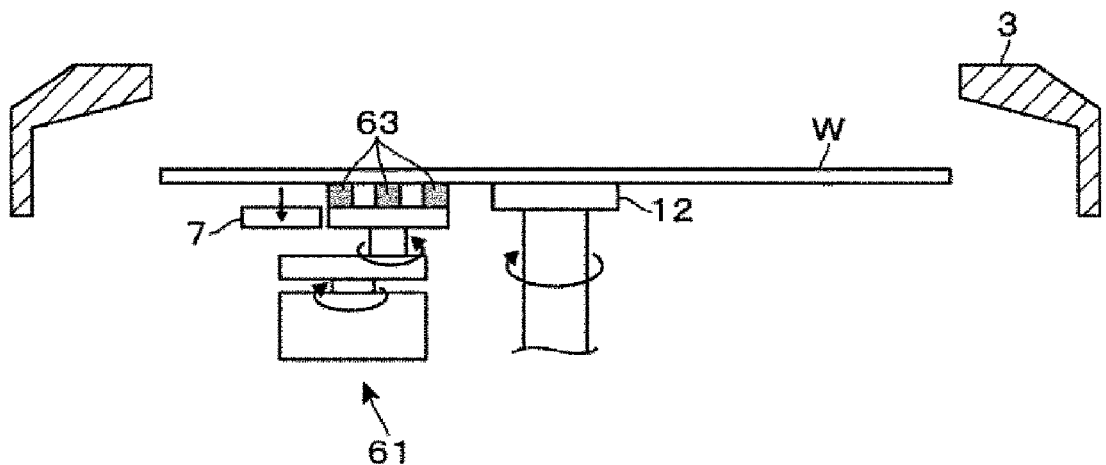
FIG. 15 is a side view of the wafer for showing a wafer processing process.

Subsequently, the processing of the wafer W in the polishing apparatus 1 will be described with reference to FIGS. 7 to 13 which are schematic plan views of the polishing apparatus 1 and FIGS. 14 to 16 which are side views of the wafer W. In FIGS. 7 to 13, the cleaning mechanism 62 is indicated by a chain line when the polishing by the polishing mechanism 61 is being performed, and the polishing mechanism 61 is indicated by a chain line when the cleaning by the cleaning mechanism 62 is being performed.

Figure 7:
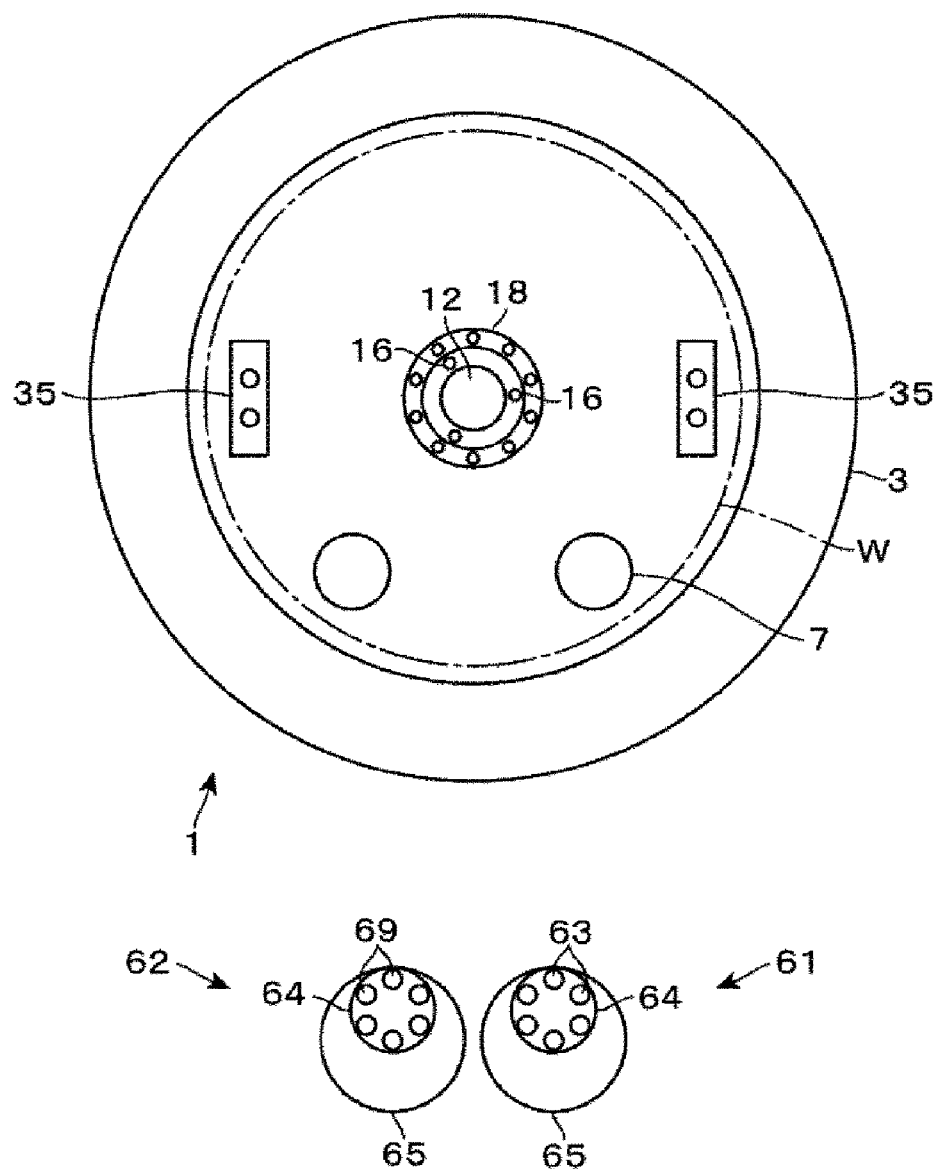
FIG. 7 is a plan view of the polishing apparatus for showing a wafer processing process.

The polishing mechanism 61 and the cleaning mechanism 62 are located, for example, at a standby position (the position shown in FIG. 1) on the rear side in the recess 13 of the base body 11, and the cup 3 is located at a reference position (the position shown in FIG. 1) where the center of the cup 3 overlaps with the center of the spin chuck 12. In this state, the wafer W is transferred to the polishing apparatus 1 by a transfer mechanism outside the polishing apparatus 1. When the central portion of the wafer W is positioned above the spin chuck 12, the support pins 16 are move upward to support the wafer W. Then, after the cup 3 is moved upward so that the fixed chuck 35 is located at a position higher than the spin chuck 12, the support pins 16 are moved downward and the wafer W is delivered to the fixed chuck 35. The outer region in the central portion of the back surface of the wafer W is sucked and held by the fixed chuck 35 (FIG. 7). Subsequently, the cup 3 is moved rearward such that the central portion of the wafer W is located on the rear side of the air knife 18.

The polishing mechanism 61 and the cleaning mechanism 62 move forward, pass through the lower side of the cup 3, and move to the inside of the cup 3. Then, if the polishing mechanism 61 is moved upward and if the grindstones 63 are pressed against the back surface of the wafer W in a state in which the revolution axis P2 of the polishing mechanism 61 overlaps with the center of the wafer W, the support plate 64 of the polishing mechanism 61 rotates and revolves so that the central portion of the wafer W is polished by the grindstones 63 (see FIGS. 8 and 14). By virtue of the rotation and revolution of the support plate 64, the respective portions in the central portion of the back surface of the wafer W are repetitively rubbed by the grindstones 63 from mutually different directions, whereby grooves are formed.

Thereafter, the rotation and the revolution of the support plate 64 of the polishing mechanism 61 are stopped, the polishing mechanism 61 is moved down, and the grindstones 63 are separated from the back surface of the wafer W. Thereafter, the cleaning mechanism 62 is moved horizontally and then moved upward to a position where the revolution axis P2 of the cleaning mechanism 62 overlaps with the center of the wafer W, whereby the brushes 69 are pressed against the back surface of the wafer W. Subsequently, the support plate 64 of the cleaning mechanism 62 rotates and revolves so that the brushes 69 rub the central portion of the back surface of the wafer W, and the pure water is discharged from the back surface cleaning nozzles 37 to the central portion of the back surface of the wafer W (see FIG. 9). Due to the rubbing by the brushes 69 and the supply of the pure water, the shavings adhering to the central portion of the back surface of the wafer W are removed.

Thereafter, the rotation and the revolution of the support plate 64 of the cleaning mechanism 62 are stopped, the cleaning mechanism 62 is moved downward, and the brushes 69 are separated from the back surface of the wafer W. The cup 3 is retracted toward the reference position. The air is discharged from the air knife 18 to the central portion of the back surface of the wafer W which is being moved together with the cup 3, whereby the central portion of the back surface of the wafer W is dried. The cup 3 is moved downward at the reference position, the fixed chuck 35 is moved to the lower side of the spin chuck 12, the central portion of the back surface of the wafer W is sucked and held by the spin chuck 12, and the holding of the wafer W by the fixed chuck 35 is released.

In front of the spin chuck 12, the polishing mechanism 61 is horizontally moved to the region sandwiched between the two cyclone pads 7 in a plan view. Subsequently, the air is supplied to the cyclone pads 7 at a first flow rate, whereby the peripheral portion of the wafer W is sucked downward. The polishing mechanism 61 is moved upward so that the grindstones 63 are pressed against the back surface of the wafer W. Then, the support plate 64 of the polishing mechanism 61 rotates and revolves, and the wafer W rotates. Thus, an annular region (referred to as a first annular region) adjacent to the central portion of the back surface of the wafer W already polished is polished by the grindstones 63 (see FIGS. 10 and 15). Similar to the polishing of the central portion of the back surface of the wafer W, the respective portions of the first annular region are repetitively rubbed by the grindstones 63 from mutually different directions due to the rotation and the revolution of the support plate 64, whereby grooves are formed.

Thereafter, the rotation and the revolution of the support plate 64 of the polishing mechanism 61 are stopped. The polishing mechanism 61 is moved downward and then slightly moved backward. Then, the flow rate of the air supplied to the cyclone pads 7 is increased to a second flow rate larger than the first flow rate. The suction pressure for sucking the rotating wafer W is increased. The polishing mechanism 61 is moved upward so that the grindstones 63 are pressed against the back surface of the wafer W. Then, the support plate 64 of the polishing mechanism 61 rotates and revolves. Thus, an annular region (second annular region) including the peripheral portion on the back surface of the wafer W is polished by the grindstones 63 (see FIGS. 11 and 16). For example, the inner circumferential side of the second annular region overlaps with the already polished first annular region. By polishing the second annular region in this way, even in the region from outside of the first annular region to the peripheral edge of the wafer W, grooves are formed in the same manner as the first annular region and the central portion of the wafer W.

Thereafter, the rotation and the revolution of the support plate 64 of the polishing mechanism 61 are stopped. When the polishing mechanism 61 is moved downward to separate the grindstones 63 from the back surface of the wafer W, in front of the spin chuck 12, the cleaning mechanism 62 is horizontally moved to the region sandwiched between the two cyclone pads 7 in a plan view. The flow rate of the air supplied to the cyclone pads 7 is decreased to the first flow rate, whereby the suction pressure for sucking the rotating wafer W is reduced. Thereafter, the cleaning mechanism 62 is moved upward so that the brushes 69 are pressed against the back surface of the wafer W. The support plate 64 of the cleaning mechanism 62 rotates and revolves so the above-described first annular region is rubbed by the brushes 69 (see FIG. 12).

While the rubbing by the brushes 69 is performed in this manner, the discharge of the pure water from the front surface cleaning nozzle 28 to the front surface of the wafer W, the discharge of the pure water from the peripheral portion cleaning nozzles 36 to the peripheral portion of the back surface of the wafer W, the discharge of the pure water from the back surface cleaning nozzles 37 to the region inside the peripheral portion of the back surface of the wafer W, and the discharge of the air from the air knife 18 are performed. By virtue of the rubbing by the brushes 69 and the supply of the pure water, the shavings adhering to the wafer W are removed. In addition, by virtue of the air discharged from the air knife 18, the pure water is prevented from adhering to the central portion of the back surface of the wafer W.

Thereafter, the rotation and the revolution of the support plate 64 of the cleaning mechanism 62 are stopped. The cleaning mechanism 62 is moved downward and then slightly moved backward. Then, the flow rate of the air supplied to the cyclone pads 7 is increased to the second flow rate, whereby the suction pressure for sucking the rotating wafer W is increased. The cleaning mechanism 62 is moved upward, whereby the brushes 69 are pressed against the back surface of the wafer W. Then, the support plate 64 of the cleaning mechanism 62 rotates and revolves. As a result, the second annular region on the back surface of the wafer W is rubbed by the brushes 69 (see FIG. 13). The discharge of the air from the air knife 18 and the discharge of the pure water from the nozzles 28, 36, and 37 are continued. The shavings adhering to the wafer W are removed by virtue of the rubbing by the brushes 69 and the discharge of the pure water.

Thereafter, the rotation and the revolution of the support plate 64 of the cleaning mechanism 62 are stopped. When the cleaning mechanism 62 is moved downward to separate the brushes 69 from the back surface of the wafer W, the polishing mechanism 61 and the cleaning mechanism 62 pass through the lower side of the cup 3 and retreat to the standby position. Then, the discharge of the air from the air knife 18 and the discharge of the pure water from the nozzles 28, 36, and 37 are stopped. When the pure water is shaken off from the wafer W by the centrifugal force of the rotation of the wafer W and the wafer W is dried, the rotation of the wafer W is stopped. Thereafter, the support pins 16 are moved upward to push up the wafer W from the spin chuck 12. The wafer W is delivered to the transfer mechanism and unloaded from the polishing apparatus 1.

Figure 17A:
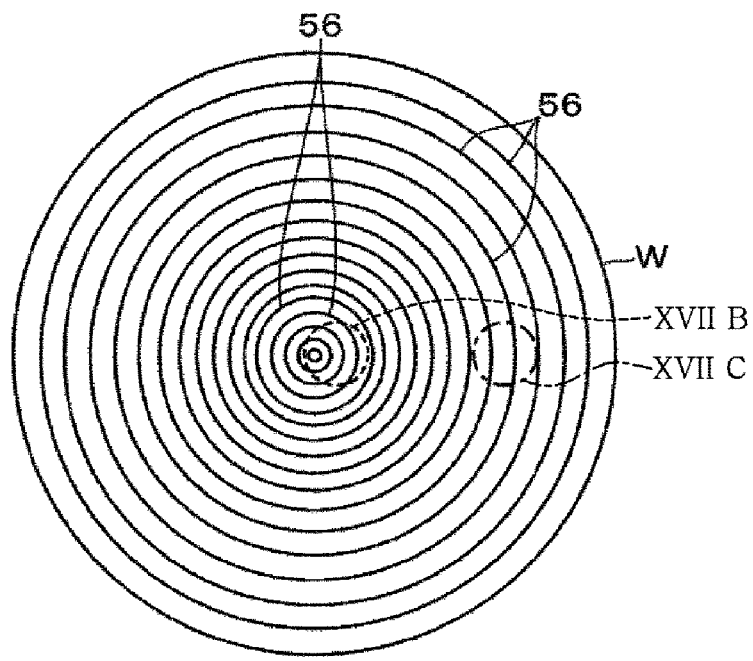
FIGS. 17A to 17C are schematic plan views showing the back surface of a wafer
Figure 17B:
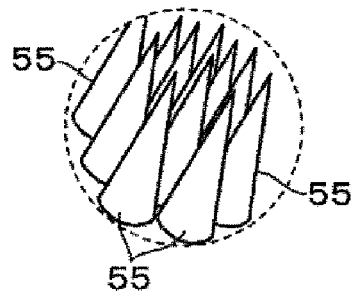
Figure 17C:
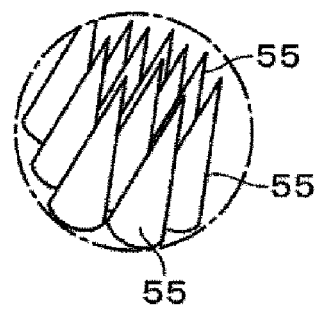

FIGS. 17A to 17C schematically show the back surface of the wafer W which has been processed by the polishing apparatus 1. As described above, in the central portion of the wafer W, fine grooves are formed around the center of the wafer W along the circumference of the wafer W as the support plate 64 and the grindstones 63, which are rotating members, revolve around the center of the wafer W. Since the support plate 64 and the grindstones 63 rotate during the revolution, the grooves are also formed so as to extend in directions other than the circumferential direction. By forming the grooves from different directions in this way, in the central portion of the back surface of the wafer W, innumerable minute needle-like protrusions 55 are distributed in the plane of the wafer W. In FIG. 17A, as for the grooves of the central portion of the back surface of the wafer W, only the grooves formed in the circumferential direction are schematically shown by reference numeral 56. In addition, a schematic perspective view enlarging the central portion of the back surface of the wafer W is shown within a dot line frame (see FIG. 17B).

In the peripheral portion of the wafer W, namely in the first annular region and the second annular region, as described above, the support plate 64 and the grindstones 63, which are rotating members, revolve around the center of the wafer W and the wafer W rotates. Accordingly, the revolution trajectory of the support plate 64 and the grindstones 63 moves along the circumferential direction of the wafer W. Therefore, fine grooves extending along the circumferential direction of the wafer W are also formed in the peripheral portion of the wafer W. These grooves are also schematically shown by reference numeral 56 in FIG. 17A. That is to say, the grooves 56 are concentrically formed over the entire back surface of the wafer W. Since the support plate 64 and the grindstones 63 rotate about their own axes during the revolution, as in the central portion of the wafer W, the grooves of the peripheral portion of the wafer W are formed so as to extend in directions other than the circumferential direction of the wafer W. By forming the grooves from different directions in this way, as in the central portion of the back surface of the wafer W, even in the peripheral portion of the back surface of the wafer W, innumerable minute needle-like protrusions 55 are distributed in the plane of the wafer W. In addition, as for the grooves of the peripheral portion of the back surface of the wafer W, the grooves formed in the directions other than the circumferential direction are not shown. Moreover, a schematic perspective view enlarging the peripheral portion of the back surface of the wafer W is shown within a chain line frame (see FIG. 17C). The height from the distal end to the proximal end of the respective protrusions 55 formed in the central portion and the peripheral portion in this manner is, for example, 50 nm or less.

The wafer W processed by the polishing apparatus 1 as described above and having the protrusions 55 formed thereon is mounted on a stage 91 provided in an exposure machine. A resist film formed on the front surface of the wafer W before or after the processing by the polishing apparatus 1 is exposed along a predetermined pattern. A roughness reducing process is not performed on the back surface of the wafer W until the wafer W is transferred to the stage 91. Specifically, the roughness reducing process includes a process of flattening the back surface of the wafer W by supplying, for example, a chemical solution that dissolves the back surface of the wafer W, such as hydrofluoric acid or the like.

In order to explain the effect of the polishing apparatus 1, a state in which the wafer W is mounted on the stage 91 will be described. First, the configuration of the stage 91 will be described with reference to a vertical sectional side view of FIG. 18. The stage 91 is circular. On the surface of the stage 91, a large number of pins 92 are disposed along concentric circles having a center coinciding with the center of the surface of the stage 91 in a mutually spaced-apart relationship. The back surface of the wafer W is supported by the pins 92. In other words, the back surface of the wafer W is supported so as to float from the surface of the stage 91.

Figure 18:
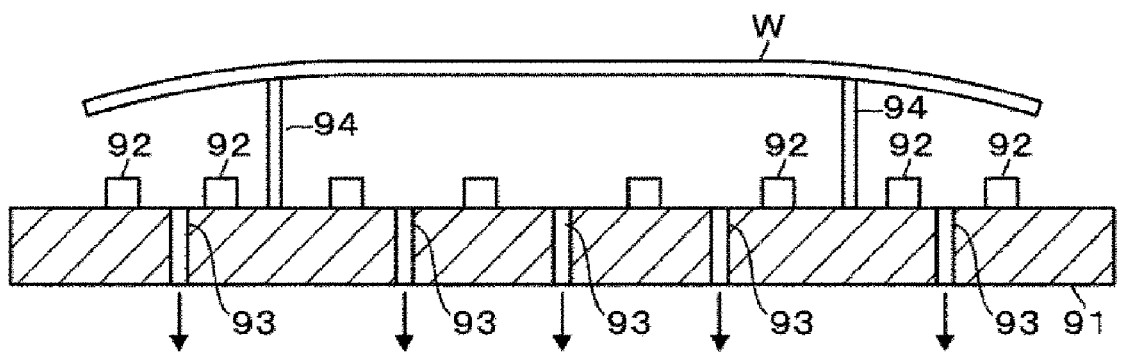
FIG. 18 is a side view showing the wafer roughened by the polishing apparatus.

On the surface of the stage 91, a large number of suction ports 93 are dispersedly opened in the positions not overlapping with the pins 92. Further, the stage 91 includes lift pins 94 configured to be movable upward and downward with respect to the stage 91. In order to transfer the wafer W between the transfer mechanism for the wafer W and the stage 91, the tip portions of the lift pins 94 protrude or retract with respect to the surface of the stage 91. Although there are provided three lift pins 94, only two lift pins 94 are shown in FIG. 18.

Figure 19A:
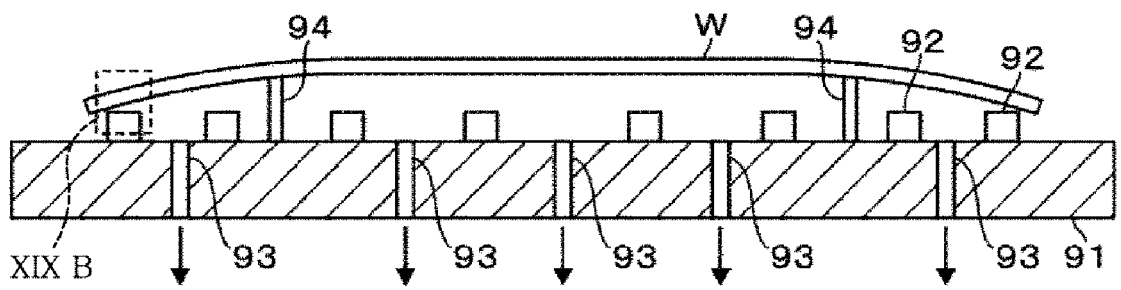
FIGS. 19A and 19B are side views showing the wafer roughened by the polishing apparatus.
Figure 19B:
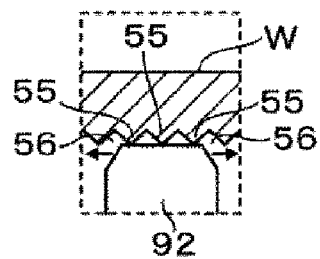

The wafer W subjected to the polishing process and the cleaning process in the polishing apparatus 1 as described above is transferred to the stage 91 by the transfer mechanism. The back surface of the wafer W is supported by the lift pins 94 as shown in FIG. 18. For example, distortion is generated in the wafer W due to the stress of the film formed until the wafer W is transferred to the stage 91. This distortion also includes warping. Subsequently, the lift pins 94 are moved downward. When the lift pins 94 are moved downward, suction is performed from the suction ports 93 of the stage 91. Then, the respective portions of the back surface of the wafer W are mounted on the pins 92, and the back surface of the wafer W is sucked toward the stage 91 by the suction from the suction ports 93 (see FIG. 19A). In a dot line frame of FIG. 19A, the vertical sectional side surfaces of the pin 92 and the back surface of the wafer W making contact with the pin 92 are shown in an enlarged state (see FIG. 19B).

As described with reference to FIGS. 17A to 17C, the grooves 56 are formed on the back surface of the wafer W along the circumferential direction of the wafer W so as to extend over the entire back surface of the wafer W. That is to say, the grooves 56 are formed so as to correspond to the arrangement of the pins 92. The protrusions 55 formed between the grooves 56 and the pins 92 of the stage 91 come into contact with each other. Since the protrusions 55 are needle-like and minute, the contact area between the protrusions 95 and the pins 92 is very small. Therefore, the frictional force acting between the back surface of the wafer W and the pins 92 is very small. Thus, the back surface of the wafer W has high slipperiness with respect to the upper surfaces of the pins 92. By having such slipperiness and being sucked by the stage 91, the wafer W is corrected in shape so as to be stretched. The wafer W is mounted on the pins 92 in a state in which the distortion is eliminated so that the wafer W becomes flat (see FIG. 20). An exposure shot is performed on the wafer W mounted on the stage 91 as described above.

According to the above-described polishing apparatus 1, when the region not overlapping with the central portion of the back surface of the wafer W is held by the fixed chuck 35, the support plate 64 of the polishing mechanism 61 rotates and revolves so that the grindstones 63 provided in the support plate 64 slide on the central portion of the back surface of the wafer W to perform the polishing process. When the central portion of the back surface of the wafer W is held by the spin chuck 12 and the wafer W is being rotated, the support plate 64 of the polishing mechanism 61 rotates and revolves so that the grindstones 63 slide on the first annular region and the second annular region, which are the peripheral portion of the back surface of the wafer W, to perform the polishing process. The respective portions in the central portion and the peripheral portion of the back surface of the wafer W are repetitively rubbed by the grindstones 63 from mutually different directions to form a large number of fine protrusions 55. In this way, the fine protrusions 55 are formed with high uniformity in the central portion and the peripheral portion, whereby the wafer W is mounted on the stage 91 with high flatness. Then, as a result of mounting the wafer W with high flatness, when exposing the wafer W mounted as described above, the exposed region is prevented from deviating from a predetermined region. Accordingly, it is possible to increase the accuracy of overlay.

In the polishing apparatus 1, it is unnecessary to provide a holding part for holding the peripheral edge of the wafer W. This makes it possible to perform the processing by locating the grindstones 63 and the brushes 69 on the peripheral portion of the back surface of the wafer W. Therefore, from this point as well, it is possible to perform uniform processing on the back surface of the wafer W and to form the protrusions 55 so as to have high slipperiness with respect to the pins 92 of the stage 91. When processing the central portion of the back surface of the wafer W, the needle-like protrusions 55 are formed by the rotation and revolution of the support plate 64 of the polishing mechanism 61. In order to form such protrusions 55, it is conceivable to arrange the support plate 64 in the central portion of the back surface of the wafer W to perform the rotation of the fixed chuck 35 holding the wafer W and the rotation of the support plate 64. However, if the configuration that rotates the fixed chuck 35 holding the peripheral portion of the wafer W is adopted in this manner, the apparatus becomes large-scale. Accordingly, the above-described configuration of the polishing apparatus 1 also has an advantage in that it is possible to prevent the apparatus from becoming larger.

By sucking the peripheral portion of the wafer W with the cyclone pads 7, when the grindstones 63 and the brushes 69 are pressed against the wafer W, the wafer W is prevented from warping with the peripheral portion bent upward. The peripheral portion is flattened and brought into close contact with the respective grindstones 63 and the respective brushes 69 so that the polishing and the cleaning can be reliably performed. When the second annular region, in which the aforementioned warping is more likely to occur, is processed by the pressing of the grindstones 63 and the brushes 69, the suction pressure by the cyclone pads 7 is made higher than when processing the first annular region. Consequently, the peripheral portion of the wafer W is flattened and brought into close contact with the respective grindstones 63 and the respective brushes 69 so that the polishing and the cleaning can be reliably performed. Since the peripheral portion of the wafer W can also be reliably polished using the cyclone pads 7 as described above, the lubricity with respect to the stage 91 of the exposing machine can be increased even in the peripheral portion. It is therefore possible to more reliably eliminate the distortion of the wafer W mounted on the stage 91.

When the central portion of the back surface of the wafer W is polished in the polishing process, the processing is performed so that the revolution axis P2 overlaps with the center of the wafer W. As a result, in the central portion of the back surface of the wafer W, the protrusions 55 are formed with high uniformity in the circumferential direction. Accordingly, the lubricity of the wafer W relative to the pins 92 of the stage 91 can be more reliably increased, and the wafer W can be mounted on the stage 91 in a flat state.

When the region not overlapping with the central portion of the back surface of the wafer W is held by the fixed chuck 35, the support plate 64, which is a rotation body of the cleaning mechanism 62, rotates and revolves so that the brushes 69 provided in the support plate 64 slide on the central portion of the back surface of the wafer W to clean the same. When the central portion of the back surface of the wafer W is held by the spin chuck 12 and the wafer W is being rotated, the support plate 64 of the cleaning mechanism 62 rotates and revolves so that the brushes 69 slide the peripheral portion of the back surface of the wafer W to clean the same. That is to say, the respective portions in the central portion and the peripheral portion of the back surface of the wafer W are repeatedly rubbed from mutually different directions by the brushes 69, whereby the wafer W is cleaned. As a result, it is possible to clean the respective portions of the wafer W with high uniformity and to reliably remove the shavings.

The rotation speed of the support plate 64 is, for example, 600 rpm, and the revolution speed of the support plate 64 is, for example, 15 rpm. In polishing or cleaning the peripheral portion of the wafer W, the rotation speed of the wafer W by the spin chuck 12 is, for example, 30 rpm to 45 rpm. However, when the rotation speed of the wafer W is larger than the revolution speed of the support plate 64 as described above, if the value of (the rotation speed of the wafer W)/(the revolution speed of the support plate 64) is an integer, the support plate 64 as a rotating body goes around along the same trajectory as in the preceding revolution turn when the support plate 64 makes a next revolution turn after making one revolution turn. Accordingly, in order to finely form the protrusions 55 by moving the support plate 64 so as to describe different trajectories in the plane of the wafer W each time when the support plate 64 makes a turn, it is preferable that the value of (the rotation speed of the wafer W)/(the revolution speed of the support plate 64) is set to become a numerical value other than an integer. The rotation speed of the wafer W may be lower than the revolution speed of the support plate 64. In that case, for the same reason, it is preferable that the value of (the revolution speed of the support plate 64)/(the rotation speed of the wafer W) is set to become a value other than an integer.

Figure 16:
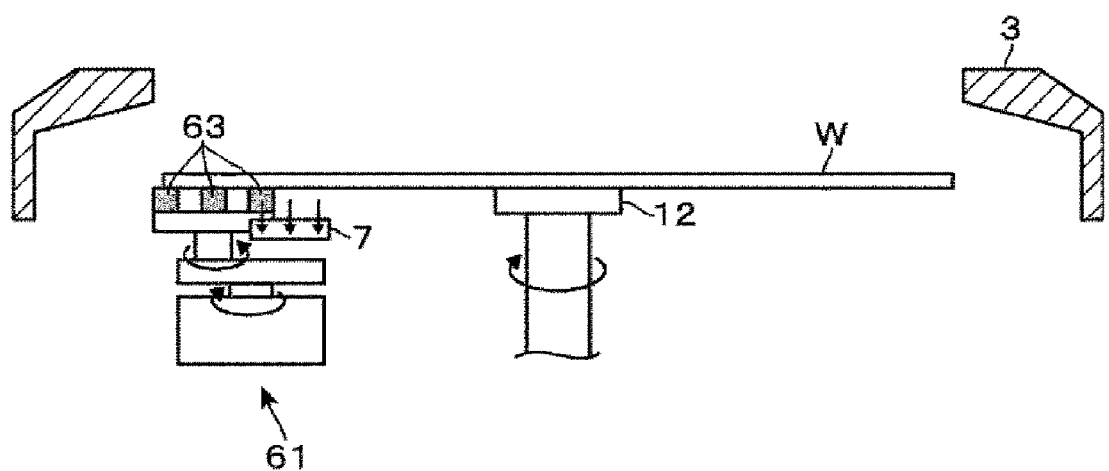
FIG. 16 is a side view of the wafer for showing a wafer processing process.

In addition, in the above polishing process, when the polishing mechanism 61 polishes the second annular region, the position of the polishing mechanism 61 is set so that the peripheral edge of the wafer W is positioned on the grindstone 63 lying furthest away from the center of the wafer W when the support plate 64 is located closest to the outer end of the wafer W (see FIG. 16). The reason why the position of the polishing mechanism 61 is set as described above is that if the grindstones 63 are positioned more outward than the peripheral edge of the wafer W away from the center of the wafer W, the grinding stones 63 may collide with the lateral end of the wafer W when the grindstones 63 moves toward the center of the wafer W by revolution. For the same reason, when the cleaning mechanism 62 cleans the second annular region, the position of the cleaning mechanism 62 is set so that the peripheral edge of the wafer W is positioned on the brush 69 lying furthest away from the center of the wafer W when the support plate 64 is located closest to the outer end of the wafer W.

In the processing example described above, the processing of the first annular region and the processing of the second annular region are respectively performed by changing the position of the polishing mechanism 61. That is to say, the polishing process of the peripheral portion of the wafer W is performed in two steps. However, the peripheral portion of the wafer W may be polished in a single step by forming the support plate 64 of the polishing mechanism 61 to become relatively large and adopting a configuration in which the revolution trajectory of the support plate 64 extends from a position adjoining the central portion of the wafer W to the peripheral edge portion of the wafer W. Similarly, the peripheral portion of the wafer W may be cleaned in a single step by forming the support plate 64 of the cleaning mechanism 62 to become relatively large and adopting a configuration in which the revolution trajectory of the support plate 64 extends from a position adjoining the central portion of the wafer W to the peripheral edge portion of the wafer W.

Figure 21:
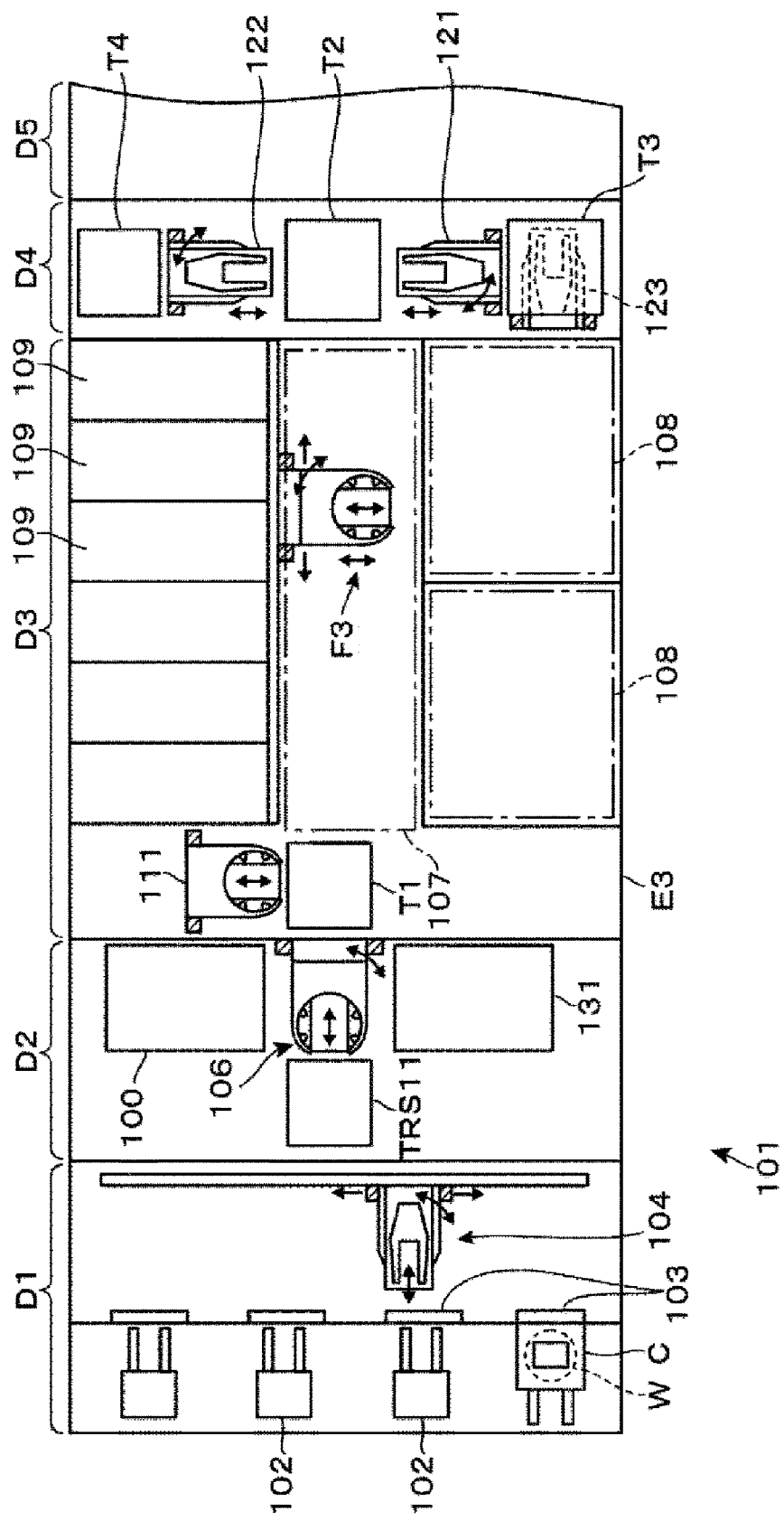
FIG. 21 is a plan view of a coating and developing apparatus including the polishing apparatus.
Figure 22:
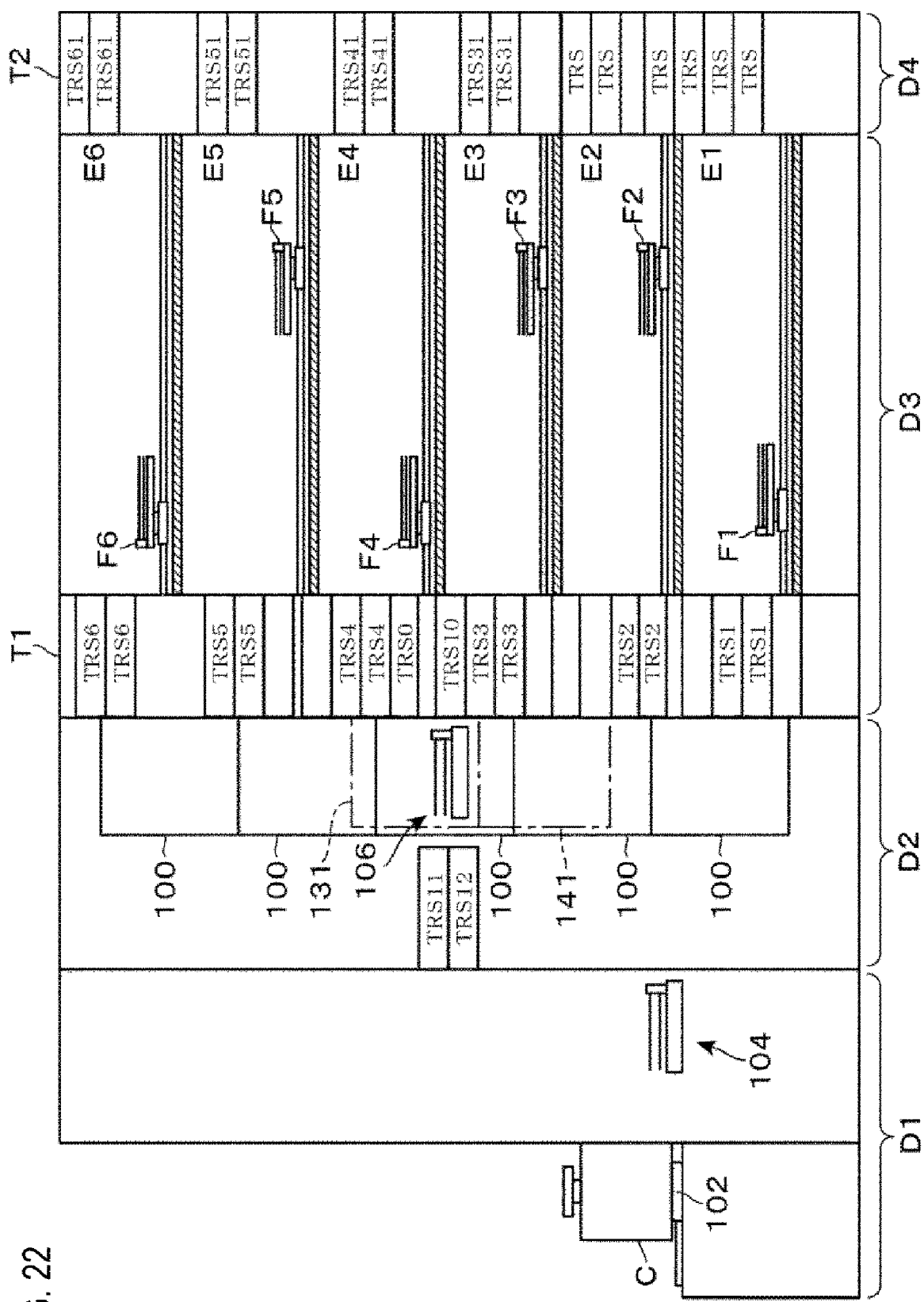
FIG. 22 is a schematic longitudinal sectional side view of the coating and developing apparatus

Subsequently, a coating and developing apparatus 101 including the above-described polishing apparatus 1 as a polishing module 100 will be described with reference to a plan view of FIG. 21 and a schematic vertical sectional side view of FIG. 22, respectively. The coating and developing apparatus 101 is configured by linearly connecting a carrier block D1, a polishing process block D2, a liquid processing block D3, and an interface block D4 in the lateral direction. An exposure machine D5 is connected to the interface block D4. In the following description, the arrangement direction of the blocks D1 to D4 is assumed to be a front-rear direction, the side of the block D1 is assumed to be a front side, and the side of the block D4 is assumed to be a rear side. A carrier C for storing the wafer W is transferred to the carrier block D1 from the outside of the coating and developing apparatus 101. The carrier block D1 includes a mounting table 102 for a carrier C, an opening/closing part 103, and a transfer mechanism 104. The transfer mechanism 104 transfers the wafer W into the carrier block D1 from the carrier C mounted on the mounting table 102 via the opening/closing part 103.

On the front side of the polishing process block D2, delivery modules TRS11 and TRS12, on which wafers W are mounted, are stacked one above another at the positions accessible by the transfer mechanism 104. A transfer mechanism 106 is provided behind the delivery modules TRS11 and TRS12. When viewed toward the rear side, for example, five polishing modules 100 are stacked on the right side of the transfer mechanism 106, and a warping amount measurement module 131 and the back surface imaging module 141 are stacked one above another on the left side of the transfer mechanism 106. In this embodiment, a transfer example not using the warping amount measurement module 131 and the back surface imaging module 141 will be described. The configuration of these modules will be described later together with a transfer example using these modules. The transfer mechanism 106 is configured to be vertically movable, rotatable about a vertical axis and movable back and forth so that the wafer W can be delivered between the respective modules provided in the polishing process block D2 and the delivery modules TRS0 to TRS10 included in a tower T1 described later.

The liquid processing block D3 is configured by stacking first to sixth unit blocks E1 to E6 for liquid processing of the wafer W sequentially from the bottom. The unit blocks E1 and E2 are unit blocks for forming an antireflection film and are configured similarly to each other. The unit blocks E3 and E4 are unit blocks for forming a resist film and are configured similarly to each other. The unit blocks E5 and E6 are unit blocks for development processing and are configured similarly to each other. In the respective unit blocks, the transfer and processing of the wafers W are performed in parallel with each other. The wafer W is transferred to one of the two similarly-configured unit blocks and is subjected to liquid processing.

As a representative of the unit blocks, the third unit block E3 will now be described with reference to FIG. 21. In the unit block E3, there is formed a transfer region 107 for the wafer W extending in the front-rear direction. When viewed toward the rear side, on the right side of the transfer region 107, two resist film forming modules 108 are provided side by side in the front-rear direction. The resist film forming modules 108 are configured to supply a resist as a chemical solution to the front surface of the wafer W, thereby forming a resist film. When viewed toward the rear side, on the left side of the transfer region 107, a plurality of heating modules 109 stacked in a plurality of stages is provided in the front-rear direction. In the transfer region 107, there is provided a transfer mechanism F3 for the wafer W.

The difference between the unit blocks E1, E2, E5, and E6 and the unit blocks E3 and E4 will be described. The unit blocks E1 and E2 are provided with an antireflection film forming module instead of the resist film forming module 108. In the antireflection film forming module, a chemical solution for forming an antireflection film is supplied to the wafer W. The unit blocks E5 and E6 are provided with a developing module instead of the resist film forming modules 108. The developing module supplies a developing solution as a chemical solution to the front surface of the wafer W so that the resist film exposed by the exposure machine D5 along a predetermined pattern is developed to form a resist pattern. Except for such differences, the unit blocks E1 to E6 are configured similarly to each other. In FIG. 22, the transfer mechanisms of the respective unit blocks E1 to E6 are shown as F1 to F6.

On the front side of the liquid processing block D3, there are provided a tower T1 extending vertically across the respective unit blocks E1 to E6 and a vertically movable transfer mechanism 111 for delivering the wafer W to each of the modules provided in the tower T1. The tower T1 includes various modules stacked one above another. For the sake of convenience, descriptions of the modules other than the delivery modules TRS are omitted. The delivery modules TRS provided at the respective heights of the unit blocks E1 to E6 can deliver the wafer W to and from the respective transfer mechanisms F1 to F6 of the unit blocks E1 to E6.

The interface block D4 includes towers T2, T3 and T4 vertically extending across the unit blocks E1 to E6, and transfer mechanisms 121 to 123 for transferring the wafer W to the respective towers T2 to T4. The transfer mechanism 121 is configured to be vertically movable so as to deliver the wafer W to and from the tower T2 and the tower T3. The transfer mechanism 122 is configured to be vertically movable so as to deliver the wafer W to and from the tower T2 and the tower T4. The transfer mechanism 123 transfers the wafer W to and from the tower T2 and the exposure machine D5. The tower T2 is formed by stacking various modules one above another. Descriptions of the modules other than the delivery modules will be omitted here. In addition, modules are also provided in the towers T3 and T4. Descriptions of these modules are also omitted.

The transfer path and processing of the wafer W in the system including the coating and developing apparatus 101 and the exposure machine D5 will be described. The wafer W is transferred from the carrier C to the delivery module TRS11 of the polishing process block D2 by the transfer mechanism 104 and is subsequently transferred to the polishing module 100 by the transfer mechanism 106. As described with reference to FIGS. 7 to 16, the wafer W is subjected to the polishing process and the cleaning process. Thereafter, the wafer W is transferred to the delivery module TRS0 of the tower T1 in the liquid processing block D3 by the transfer mechanism 106.

The wafer W is transferred from the delivery module TRS0 to the unit block E1 or E2. For example, when transferring the wafer W to the unit block E1, the wafer W is delivered from the delivery module TRS0 to the delivery module TRS1 corresponding to the unit block E1 among the delivery modules TRS of the tower T1 (the delivery module capable of delivering the wafer W by the transfer mechanism F1). Furthermore, when transferring the wafer W to the unit block E2, the wafer W is delivered from the delivery module TRS0 to the delivery module TRS2 corresponding to the unit block E2 among the delivery modules TRS of the tower T1. The transfer of the wafers W is performed by the transfer mechanism 111.

Figure 20:
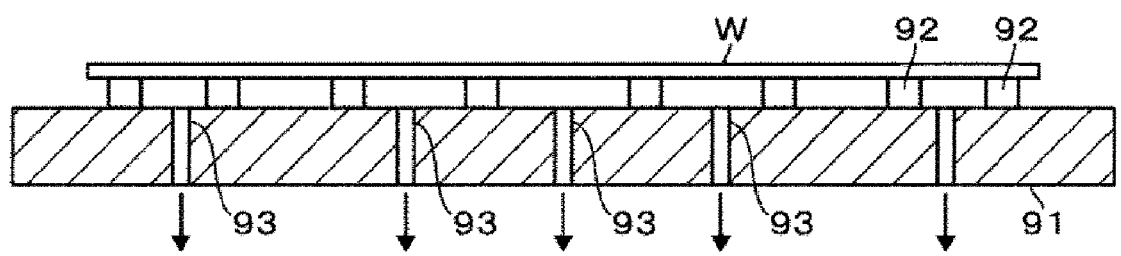
FIG. 20 is a side view showing the wafer roughened by the polishing apparatus.

The wafer W thus distributed is transferred in the order of delivery module TRS1 (TRS2)→the antireflection film forming module→the heating module→the delivery module TRS1 (TRS2) and is subsequently distributed by the transfer mechanism 111 to the delivery module TRS3 corresponding to the unit block E3 or the delivery module TRS4 corresponding to the unit block E4. The wafer W distributed to the delivery module TRS3 or TRS4 in this manner is transferred in the order of the delivery module TRS3 (TRS4)→the resist film forming module→the heating module 109→the delivery module TRS31 (TRS41) of the tower T2 of the interface block D4. Thereafter, the wafer W is transferred between the towers T2 and T3 by the transfer mechanisms 121 and 123 and is carried into the exposure machine D5. The wafer W is mounted on the stage 91 provided in the exposure machine D5 as shown in FIGS. 18 to 20. An exposure shot is performed on the wafer W, and the resist film is exposed along a predetermined pattern.

The wafer W, after the exposure, is transferred between the towers T2 and T4 by the transfer mechanisms 123 and 122, and is transferred to the delivery module TRS51 or TRS61 of the tower T2 corresponding to the unit block E5 or E6, respectively. Thereafter, the wafer W is transferred in the order of the heating module→the developing module. The resist film is dissolved along the pattern exposed by the exposure machine D5, whereby a resist pattern is formed on the wafer W. Thereafter, the wafer W is transferred to the delivery module TRS5 (TRS6) of the tower T1 and is transferred to the delivery module TRS12 by the transfer mechanism 106. Then, the wafer W is returned to the carrier C via the transfer mechanism 104.

The polishing apparatus 1 is not limited to being incorporated in the coating and developing apparatus 101 as the polishing module 100 as described above but may be provided outside the coating and developing apparatus 101. In that case, the wafer W is subjected to processing in the polishing apparatus 1 and is then transferred to the coating and developing apparatus 101 where the wafer W is processed. Even in the case of incorporating the polishing apparatus 1 in the coating and developing apparatus 101, the polishing module 100 is not limited to being installed in the above place but may be installed in, for example, the interface block D4, as long as the polishing module 100 can process the wafer W before the wafer W is transferred to the exposure machine D5.

Figure 23:
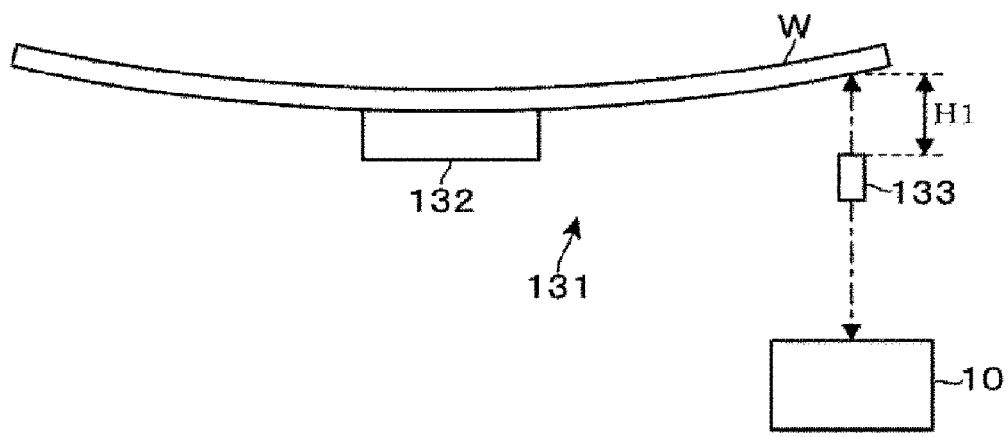
FIG. 23 is a schematic configuration diagram of a module provided in the coating and developing apparatus.

Subsequently, the warping amount measurement module 131 provided in the polishing process block D2 will be described. As shown in FIG. 23, for example, the warping amount measurement module 131 includes, for example, a stage 132 on which the central portion of the back surface of the wafer W is mounted, and a reflection type laser displacement sensor 133. The laser displacement sensor 133 irradiates laser light on the peripheral edge portion of the wafer W mounted on the stage 132 as indicated by a dotted line in FIG. 23. Then, the laser displacement sensor 133 receives the reflected light and transmits a detection signal corresponding to the received light to the control part 10 as indicated by a one-dot chain line in FIG. 23. The control part 10 acquires the distance H1 from the laser displacement sensor 133 to the peripheral edge of the wafer W. This distance H1 corresponds to the information on the warping of the wafer W.

In the control part 10 of the polishing module 100, there is provided a memory that stores a correspondence relationship between the first flow rate of the air supplied to the cyclone pads 7 when processing the first annular region and the distance H1 (referred to as a first air supply amount correspondence relationship) and a correspondence relationship between the second flow rate of the air supplied to the cyclone pads 7 when processing the second annular region and the distance H1 (referred to as a second air supply amount correspondence relationship).

The transfer path of the wafer W in the coating and developing apparatus 101 when the warping amount measurement module 131 is used will be described by focusing on differences from the above-described transfer path. The wafer W transferred from the carrier C to the delivery module TRS11 is transferred to the warping amount measurement module 131 by the transfer mechanism 106, whereby the distance H1 is acquired by the warping amount measurement module 131. The control part 10 determines the first flow rate and the second flow rate based on the acquired distance H1, the first air supply amount correspondence relationship, and the second air supply amount correspondence relationship.

Then, the wafer W is transferred from the warping amount measurement module 131 to the polishing module 100. The air is supplied to the cyclone pads 7 at the determined first flow rate and second flow rate. Then, the polishing and cleaning of the peripheral portion of the wafer W are performed. Specifically, as the distance H1 grows larger, the first flow rate and the second flow rate are set to larger values. The processing is performed so that the suction pressure by the cyclone pads 7 is increased. By controlling the suction pressure of the cyclone pads 7 in this manner, it is possible to mitigate the influence of the warped state of the wafer W and to perform the processing by reliably bringing the back surface of the wafer W into close contact with the grindstones 63 and the brushes 69.

Figure 24:
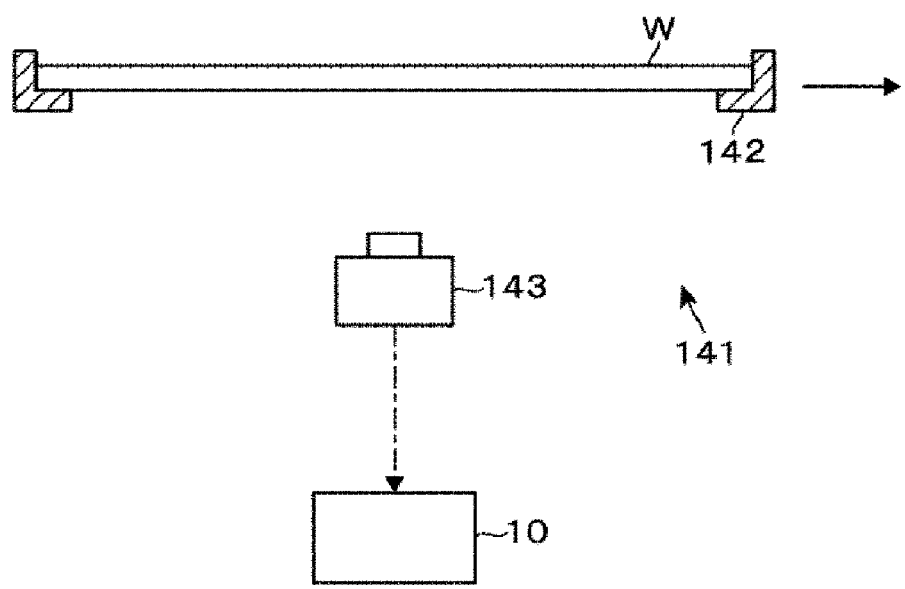
FIG. 24 is a schematic configuration diagram of a module provided in the coating and developing apparatus

Subsequently, the back surface imaging module 141 will be described with reference to FIG. 24 which is a schematic configuration diagram. The back surface imaging module 141 includes a support portion 142 that supports the peripheral portion of the back surface of the wafer W. The support portion 142 is moved in the lateral direction by a moving mechanism (not shown). Furthermore, a camera 143 is provided in the back surface imaging module 141. The camera 143 intermittently captures an image of a part of the back surface of the wafer W moved by the support portion 142, thereby acquiring an image data of the entire back surface of the wafer W. The image data acquired by the camera 143 is transmitted to the control part 10 as indicated by a chain line in FIG. 24. The transfer path in the case where the back surface imaging module 141 is used will be described. The wafer W is processed by the polishing module 100 and is then transferred to the back surface imaging module 141 by the transfer mechanism 106, whereby the above image data is acquired. Thereafter, the wafer W is transferred to the liquid processing block D3.

The control part 10 determines whether or not the polishing process of the wafer W is properly performed, based on the acquired image data. If it is determined that the polishing process of the wafer W is properly performed, the subsequent wafer W is processed by the polishing module 100 in the same manner as the preceding wafer W (the wafer W from which the image data used for determination is acquired). If it is determined that the polishing process is not properly performed, a predetermined sound output is performed by a sound output part constituting the control part 10, or a predetermined screen display is performed by a monitor constituting the control part 10. In other words, an alarm is issued by sound or screen display, whereby a user is alerted of an abnormality. In addition, when it is determined that the polishing process is not properly performed, for example, the first flow rate and the second flow rate, which are the amounts of the air supplied to the cyclone pads 7, may be respectively set to become larger by a predetermined amount. When the subsequent wafer W is processed by the polishing module 100, the wafer W may be sucked toward the grindstones 63 and the brushes 69 with a greater suction pressure.

Figure 25:
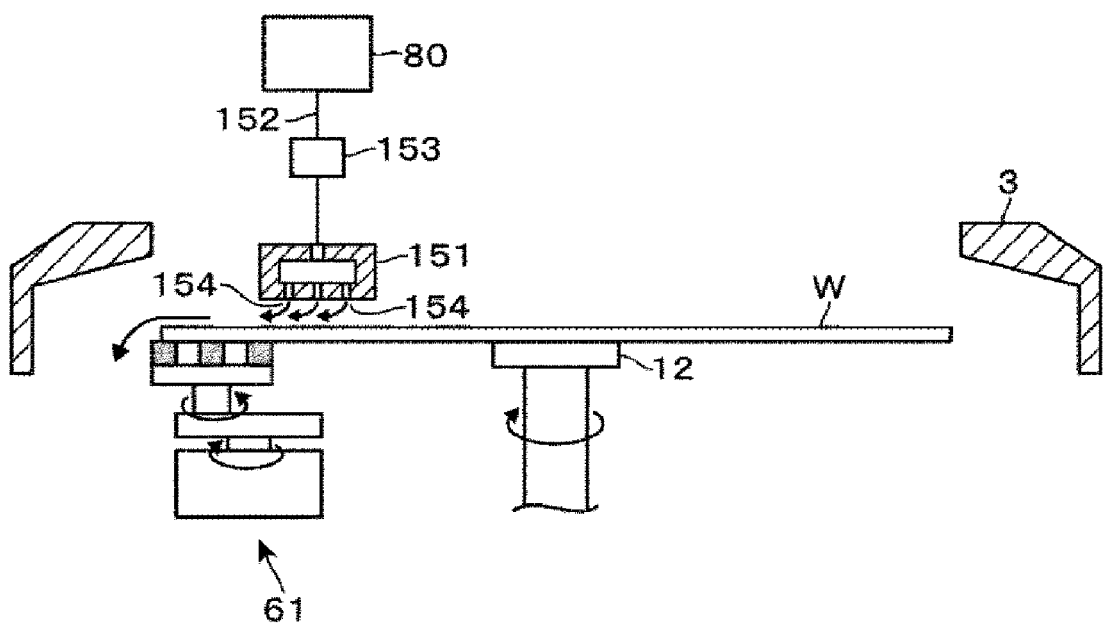
FIG. 25 is a vertical sectional side view showing another configuration of the polishing mechanism.
Figure 26:
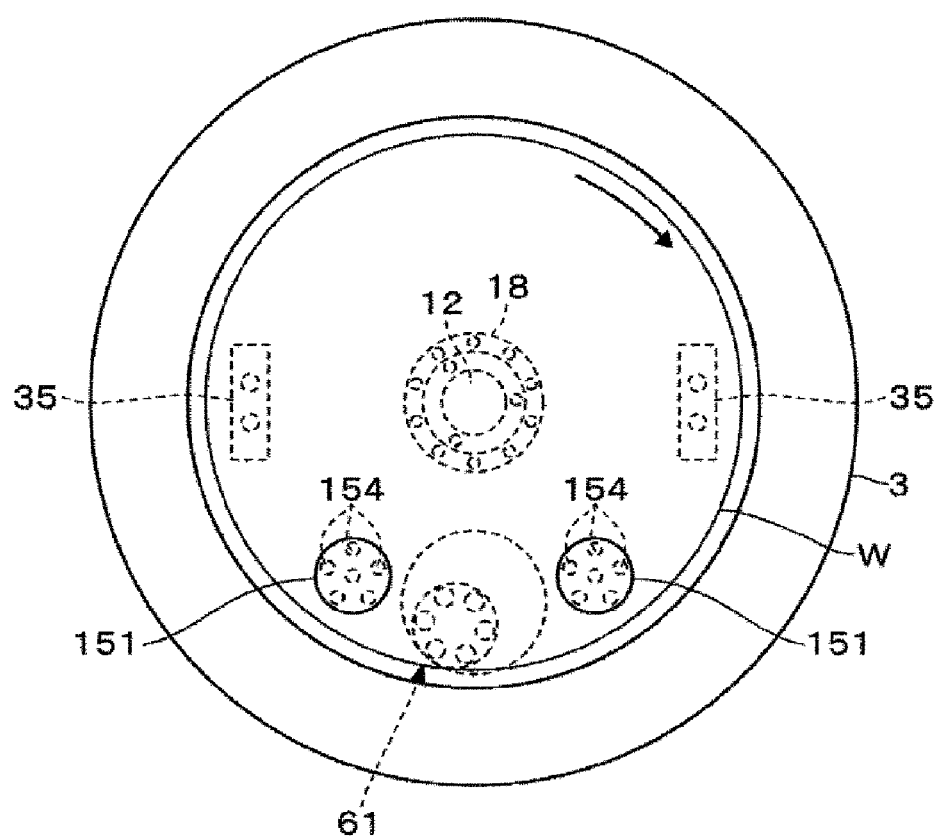
FIG. 26 is a plan view showing another configuration of the polishing mechanism.

In addition, when the wafer W is brought into close contact with the grindstones 63 and the brushes 69, in the respective embodiments described above, the wafer W is sucked from the lower side thereof by the cyclone pads 7. However, the present disclosure is not limited to sucking the wafer W from the lower side. FIGS. 25 and 26 show an example in which fluid discharge pads 151 are provided instead of the cyclone pads 7. For example, two fluid discharge pads 151 are provided above the wafer W mounted on the spin chuck 12. Each of the fluid discharge pads 151 is formed in a horizontal circular shape. The downstream end of a pure water supply pipe 152 is connected to the fluid discharge pad 151. The upstream end of the pure water supply pipe 152 is connected to the pure water supply source 80 via a flow rate adjustment part 153. The flow rate adjusting part 153 adjusts the flow rate of the pure water supplied from the pure water supply source 80 to the fluid discharge pad 151, based on a control signal transmitted from the control part 10. A large number of discharge holes 154 are dispersedly arranged in the lower portion of the fluid discharge pad 151. The supplied pure water is discharged vertically downward from the respective discharge holes 154.

When the wafer W mounted on the spin chuck 12 is processed by revolving the support plate 64 provided with the grindstones 63 or the brushes 69, the fluid discharge pads 151 are respectively arranged on the left side and the right side of the revolution trajectory as the revolution trajectory is viewed from the central portion of the wafer W. As viewed in a plan view, the fluid discharge pads 151 discharge pure water to the respective positions on the left and right of the revolution trajectory, thereby pushing the wafer W downward. As a result, the peripheral portion of the back surface of the wafer W is brought into close contact with the grindstones 63 or the brushes 69, whereby the polishing or the cleaning is performed. The downward pressing force of the wafer W can be adjusted by adjusting the flow rate of the pure water discharged from the fluid discharge pads 151 with the flow rate adjustment part 153. Therefore, for example, by making the flow rate of the pure water when processing the second annular region larger than the flow rate of the pure water when processing the first annular region so as to increase the pressing force of the peripheral portion of the wafer W applied by the pure water, the peripheral portion of the wafer W may be brought into close contact with the grindstones 63 or the brushes 69 in a more reliable manner. The fluid discharged from the fluid discharge pads 151 is not limited to a liquid such as pure water or the like but may be a gas such as air or the like.

As the flow rate of the air supplied to the cyclone pads 7 has been determined based on the distance H1 measured by the warping amount measurement module 131, the flow rate of the fluid supplied by the fluid discharge pads 151 may also be determined based on the distance H1. That is to say, a correspondence relationship between the distance H1 and the flow rate of the fluid (referred to as a fluid correspondence relationship) is stored in a memory constituting the control part 10. After the distance H1 is acquired by the module 131, the flow rate of the fluid is determined based on the distance H1 and the fluid correspondence relationship.

The cleaning mechanism 62 may not be provided in the polishing apparatus 1. The cleaning of the wafer W after polishing may be performed by transferring the wafer W to an external cleaning apparatus. However, if the polishing mechanism 61 and the cleaning mechanism 62 are provided in the same apparatus, it is not necessary to transfer the wafer W to a cleaning apparatus after polishing. This makes it possible to shorten the time from the start of the polishing process to the end of the cleaning process and to improve the throughput. Furthermore, the present disclosure may be configured as an apparatus in which the polishing mechanism 61 is not provided in the polishing apparatus 1. In other words, the present disclosure may be configured as a cleaning apparatus for cleaning the wafer W. In this cleaning apparatus, for example, before the wafer W is transferred to the exposure machine D5, the adhering foreign material is cleaned and removed. Thus, the cleaning apparatus may be used for horizontally mounting the wafer W on the stage 91. The present disclosure is not limited to the configurations of the respective embodiments described above and may be changed as appropriate. The configurations of the respective embodiments may be combined with each other.

Figure 27:
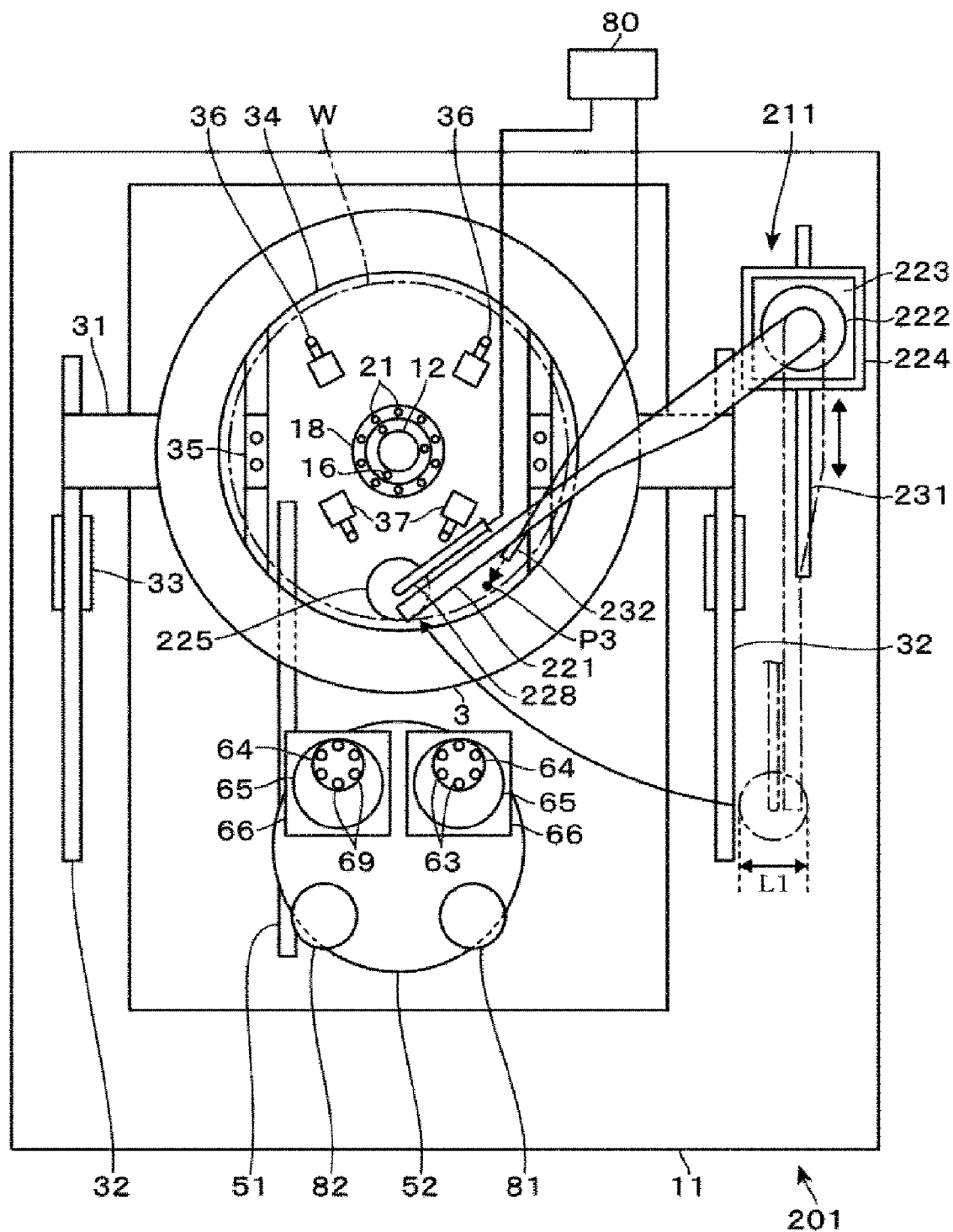
FIG. 27 is a plan view of a polishing apparatus according to another embodiment of the present disclosure.
Figure 28:
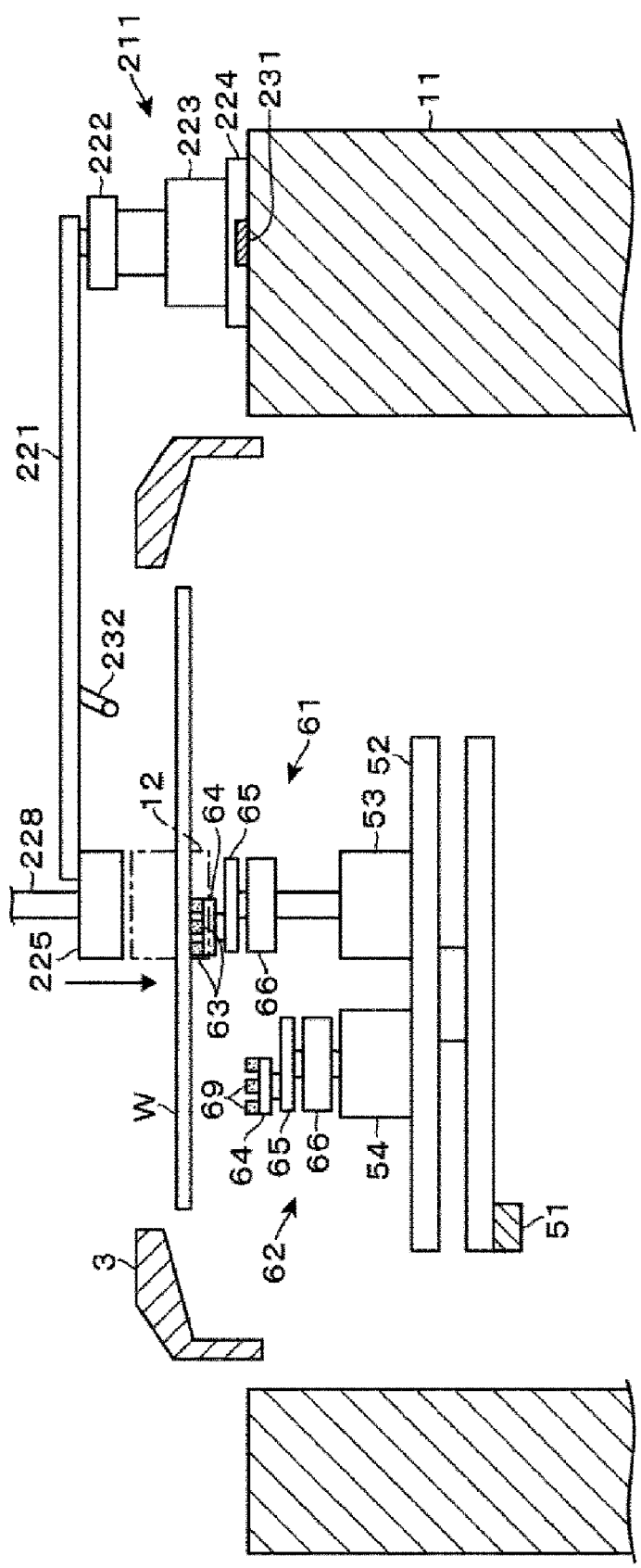
FIG. 28 is a vertical sectional side view of the polishing apparatus.

Subsequently, a polishing apparatus 201 which is another embodiment of the polishing apparatus will be described by focusing on differences from the polishing apparatus 1. FIG. 27 is a plan view of the polishing apparatus 201, and FIG. 28 is a vertical sectional front view of the polishing apparatus 201. The polishing apparatus 201 is not provided with the cyclone pads 7 and is provided with a pressing mechanism 211 instead of the cyclone pads 7. The pressing mechanism 211 presses the region of the wafer W, along which the grindstones 63 and the brushes 69 move, from the front surface side of the wafer W toward the back surface side thereof. The pressing mechanism 211 is a mechanism that suppresses deformation of the wafer W by the upward pressing of the grindstones 63 and the brushes 69, thereby making sure that the processing by the grindstones 63 and the brushes 69 is reliably performed.

The pressing mechanism 211 includes an arm 221, a rotating mechanism 222, an elevating mechanism 223, a forward/backward moving mechanism 224, and a pressing member 225. The forward/backward moving mechanism 224 moves back and forth on the base body 11. Reference numeral 231 in FIGS. 27 and 28 denotes a guide along which the forward/backward moving mechanism 224 moves. The elevating mechanism 223 is provided on the forward/backward moving mechanism 224 to raise and lower the rotating mechanism 222. The rotating mechanism 222 supports the base end side of the arm 221 and rotates the arm 221 about a vertical axis. The pressing member 225 is a flat cylindrical member and is provided at the lower end of the tip of the arm 221. By virtue of the operation of the elevating mechanism 223, the pressing member 225 makes contact with the wafer W and presses the wafer W downward, namely toward the back surface of the wafer W. When the aforementioned pressing of the wafer W is not performed, the pressing member 225 waits at a standby position above the base body 11 indicated by a chain line in FIG. 27.

Figure 29:
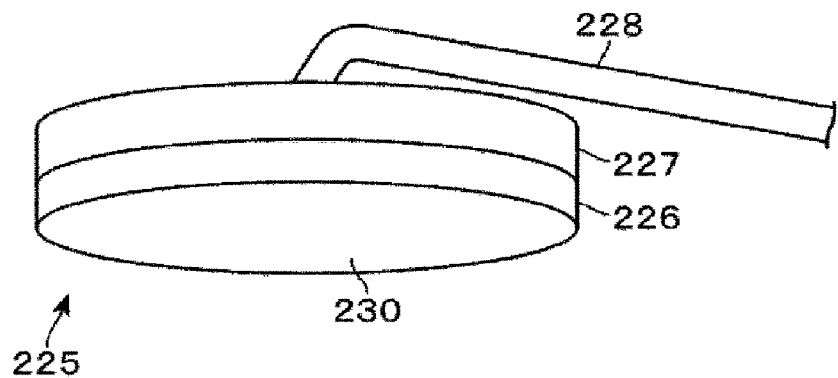
FIG. 29 is a bottom perspective view of a pressing member provided in the polishing apparatus.

The pressing member 225 will be described with reference to a perspective view of FIG. 29 and a vertical sectional side view of FIGS. 30A and 30B. The pressing member 225 is provided with a pressing part main body 226 which forms a lower portion of the pressing member 225 and has a flat circular shape. The lower surface of the pressing part main body 226 is horizontally formed so as to face the wafer W and is configured as a pressing surface 230 for pressing the wafer W. As will be described later, the pressing part main body 226 is made of a porous material having liquid absorbency with respect to a cleaning solution supplied to the pressing part main body 226 and having elasticity so as not to damage the front surface of the wafer W. More specifically, the pressing part main body 226 is configured by a sponge made of, for example, a resin such as PVA (polyvinyl alcohol) or the like. Accordingly, the pressing surface 230 is configured such that a large number of pores are dispersed on the entire surface thereof. The diameter of the wafer W is, for example, 300 mm. In this example, the diameter L1 of the pressing member 225 (see FIG. 27) is set to be about 50 mm. As will be described in detail later, the diameter of the pressing member 225 is not limited to such a size. Since the pressing member 225 is a cylinder as described above, the size of the diameter L1 of the pressing member 225 is equal to the size of the diameter of the pressing surface 230.

A disc-shaped covering portion 227 is provided so as to cover the upper side of the pressing part main body 226. The covering portion 227 is made of, for example, PTFE (polytetrafluoroethylene). The central portion of the covering portion 227 is opened. A lower end portion of a pure water supply pipe 228 made of PFA (perfluoroalkoxy fluorine resin) is provided in this opening. The upstream side of the pure water supply pipe 228 is connected to a pure water supply source 80. Pure water is supplied from the pure water supply source 80 to the pressing part main body 226. The solid line arrow in FIG. 30A indicates the flow of the pure water supplied to the pressing part main body 226. The pure water thus supplied penetrates the entire pressing part main body 226 due to the capillary phenomenon of the sponge. Since the covering portion 227 does not have a water-absorbing property, the pure water is moved downward under the action of gravity and is supplied to the wafer W from the pores of the pressing surface 230. Accordingly, the pores of the pressing surface constitute pure water supply holes.

Figure 30A:
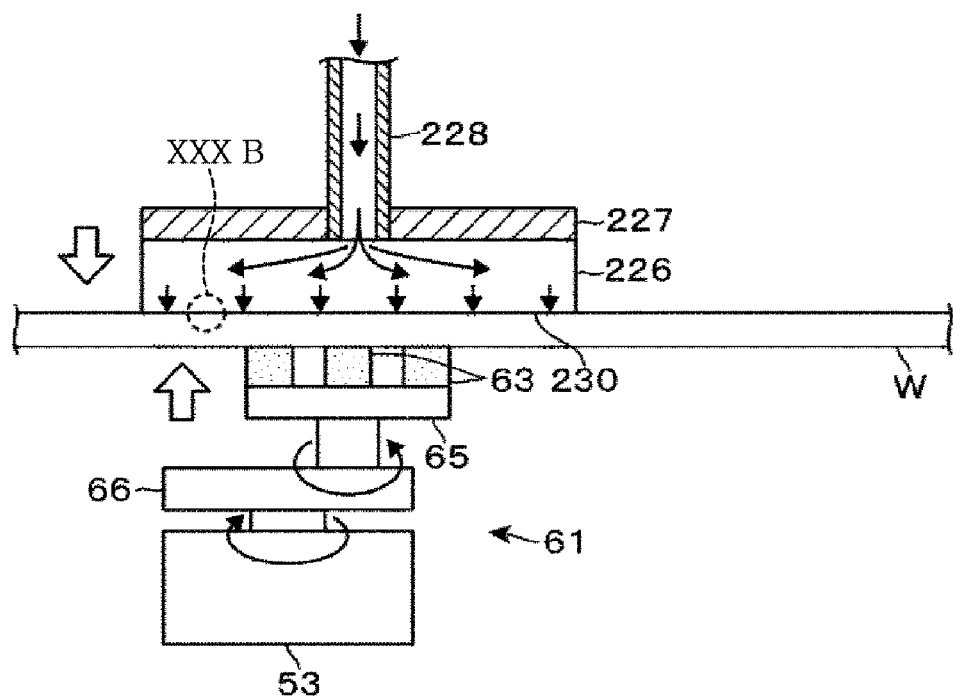
FIGS. 30A and 30B are vertical sectional side views of the pressing member.
Figure 30B:
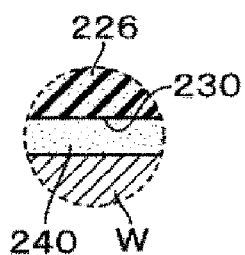

The front surface of the wafer W pressed by the pressing member 225 is shown in an enlarged state at the tip of the dotted arrow in FIG. 30A (see FIG. 30B). While the wafer W is pressed by the pressing member 225, the pure water is supplied to the pressing part main body 226 so that a liquid film of pure water 240 is interposed between the pressing part main body 226 and the front surface of the wafer W. If the pressing is performed by forming the liquid film as described above, the deformation of the wafer W due to the pressing from the back surface side is suppressed as described above, the front surface of the wafer W is cleaned and the foreign materials such as polishing wastes or the like adhering to the front surface of the wafer W are removed.

The arm 221 is provided with a front surface cleaning nozzle 232 for discharging pure water on the front surface of the wafer W separately from the pressing member 225. The front surface cleaning nozzle 232 is connected to a pure water supply source 80 via a pipe. During the pressing of the wafer W by the pressing member 225, pure water is discharged from the front surface cleaning nozzle 232. Foreign materials adhering to the front surface of the wafer W are also removed by the action of the pure water. For the purpose of removing such foreign materials, the front surface cleaning nozzle 232 discharges pure water onto the wafer W toward the outside of the wafer W. The dotted line arrow in FIG. 27 indicates the discharge direction of the pure water. The point P3 in FIG. 27 shows an example of the position where the discharged pure water lands on the wafer W.

Figure 8:
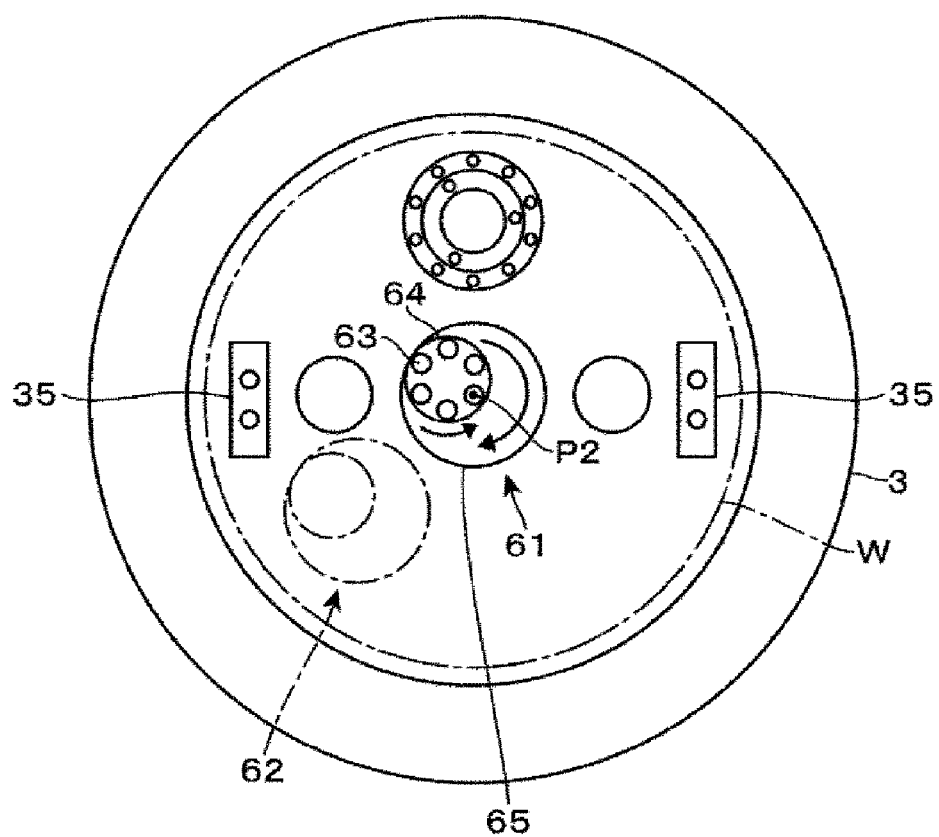
FIG. 8 is a plan view of the polishing apparatus for showing a wafer processing process.
Figure 31:
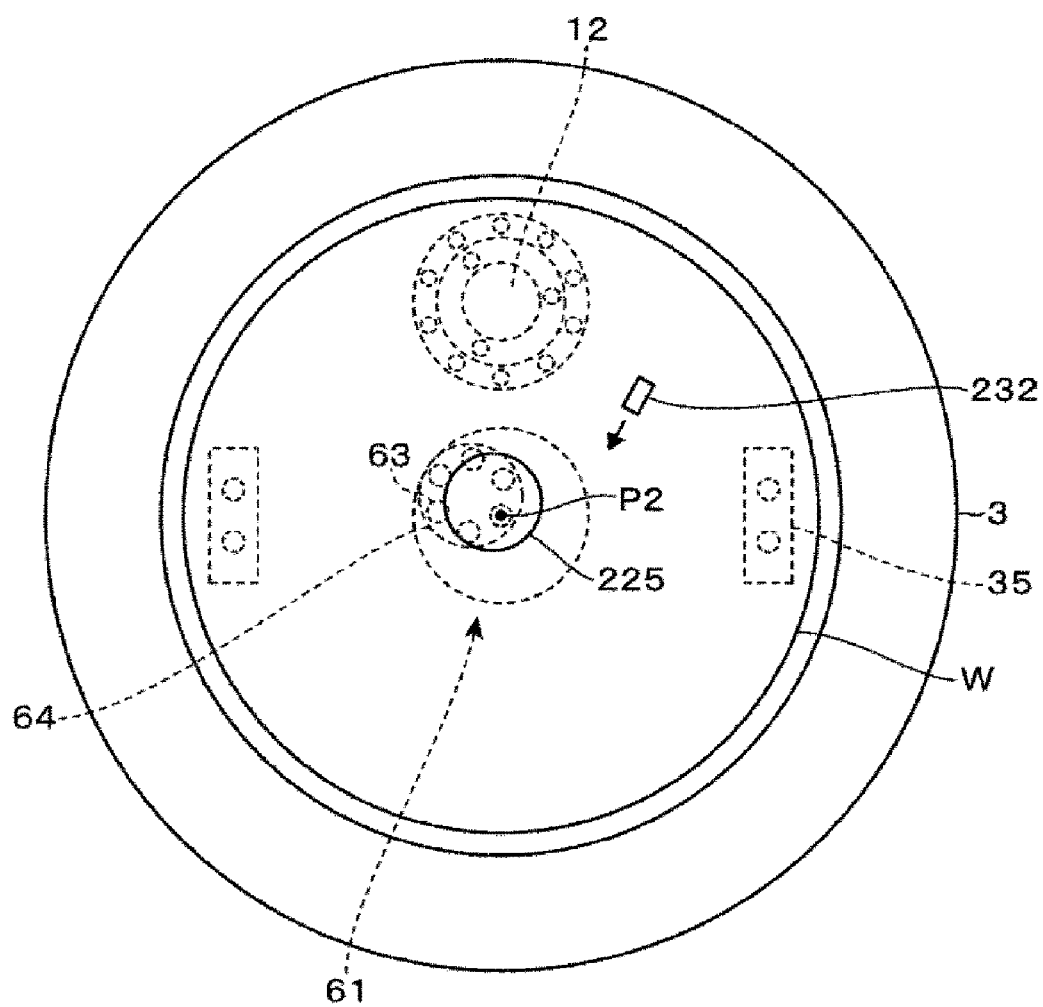
FIG. 31 is a plan view showing the operation of the polishing apparatus.
Figure 32:
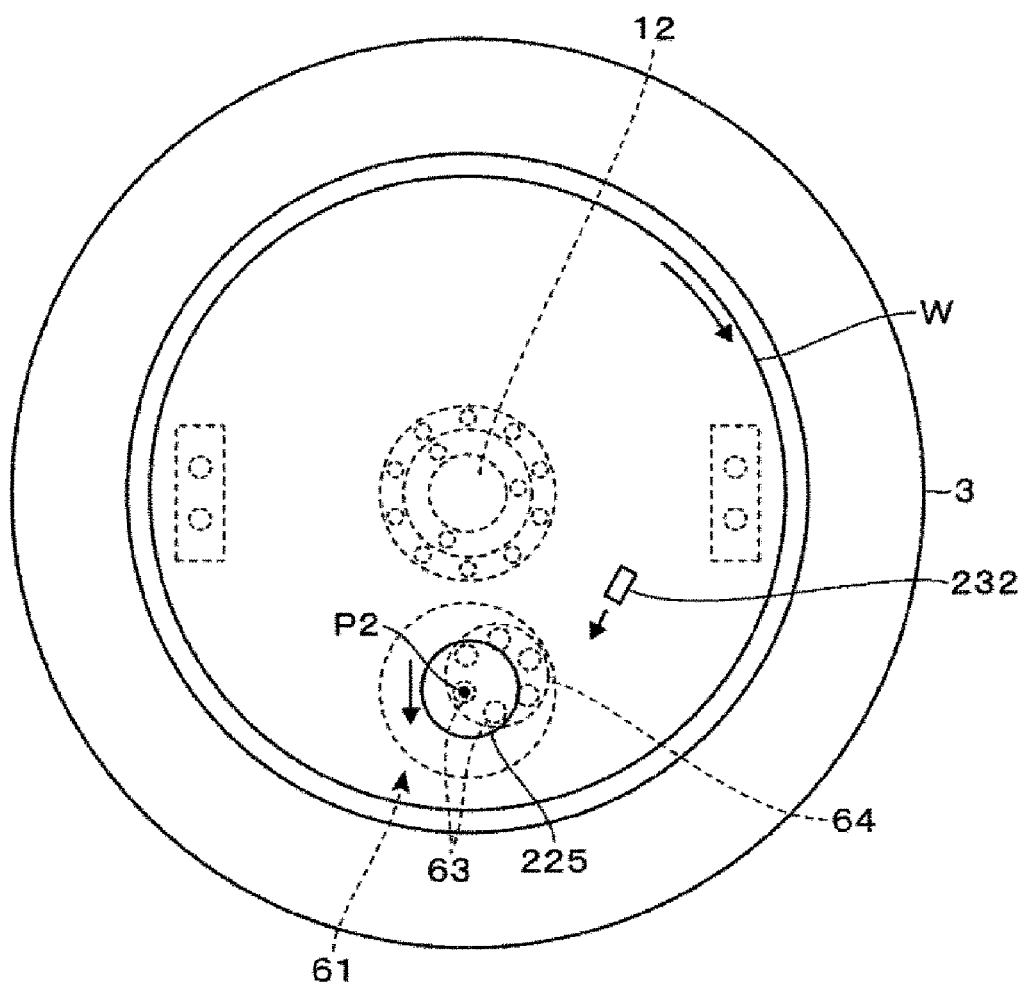
FIG. 32 is a plan view showing the operation of the polishing apparatus.
Figure 33:
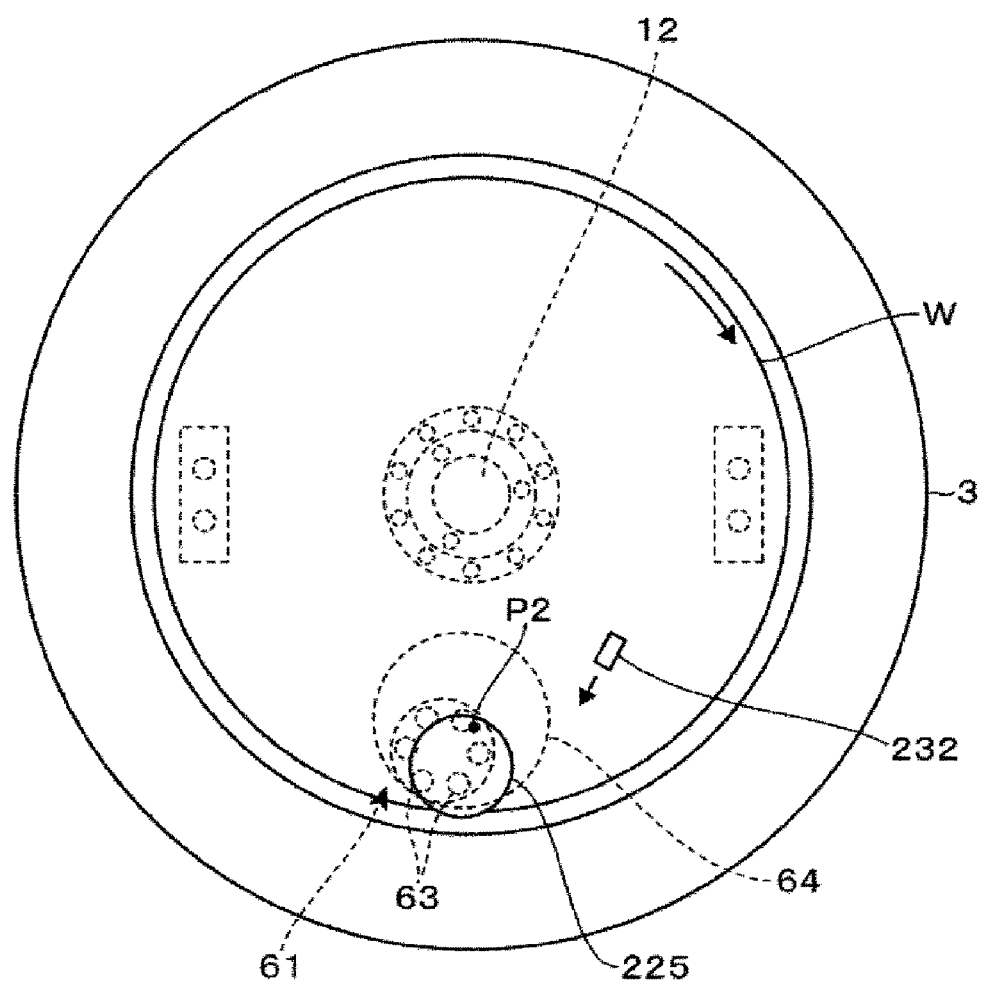
FIG. 33 is a plan view showing the operation of the polishing apparatus.
Figure 34:
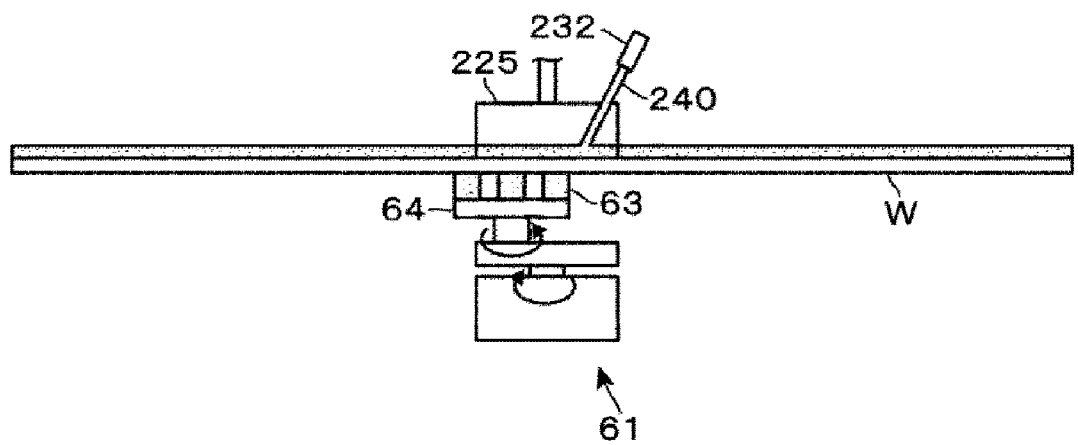
FIG. 34 is a side view showing the operation of the polishing apparatus.

An example of the operation of the polishing apparatus 201 will be described with reference to top views of the apparatus shown in FIGS. 31 to 33 and side views of the apparatus shown in FIGS. 34 to 36, by focusing on differences from the operation of the polishing apparatus 1. First, as described with reference to FIG. 8, the grindstones 63 of the polishing mechanism 61 are pressed against the central portion of the back surface of the wafer W held by the fixed chuck 35, and the pressing member 225 is moved downward in a state in which the center thereof overlaps with the revolution axis P2 of the polishing mechanism 61. The pressing member 225 faces the grindstones 63 and presses the wafer W sandwiched between the grindstones 63 and the pressing member 225. Then, the pure water 240 is supplied to the pressing part main body 226 and the pure water 240 is discharged from the front surface cleaning nozzle 232. Meanwhile, the support plate 64 of the polishing mechanism 61 described with reference to FIG. 8 is rotated and revolved, whereby the central portion of the back surface of the wafer W is polished (see FIGS. 31 and 34). By disposing the pressing member 225 as described above, the pressing member 225 presses the region through which the grindstones 63 pass when viewed in a plan view.

Figure 9:
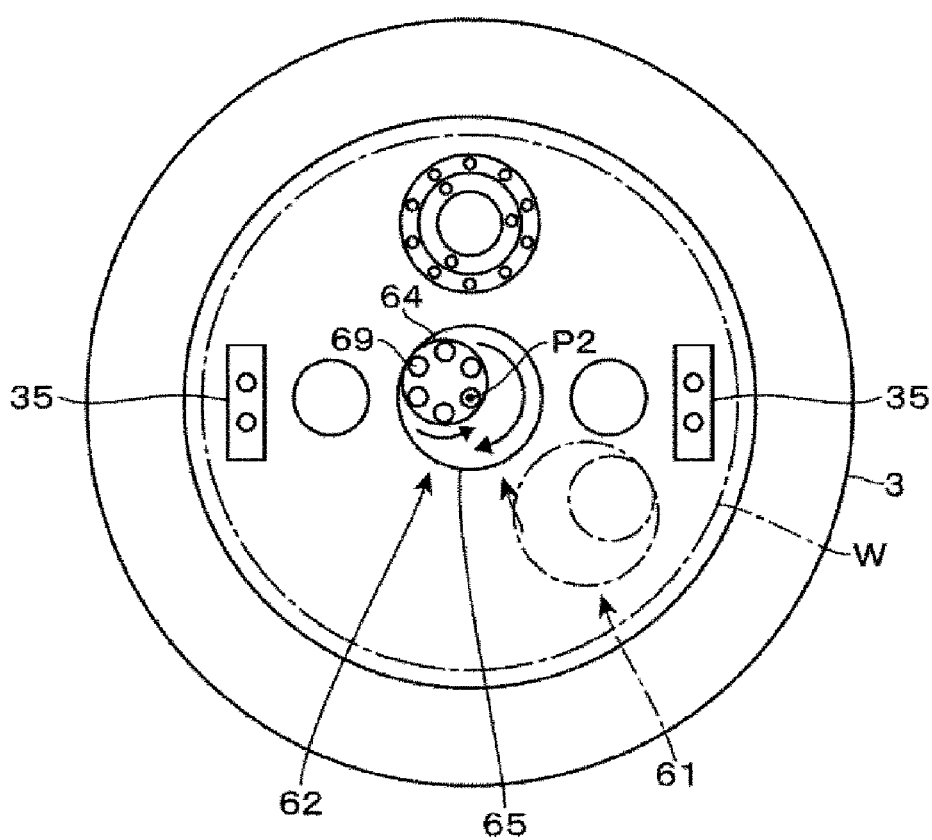
FIG. 9 is a plan view of the polishing apparatus for showing a wafer processing process.
Figure 10:
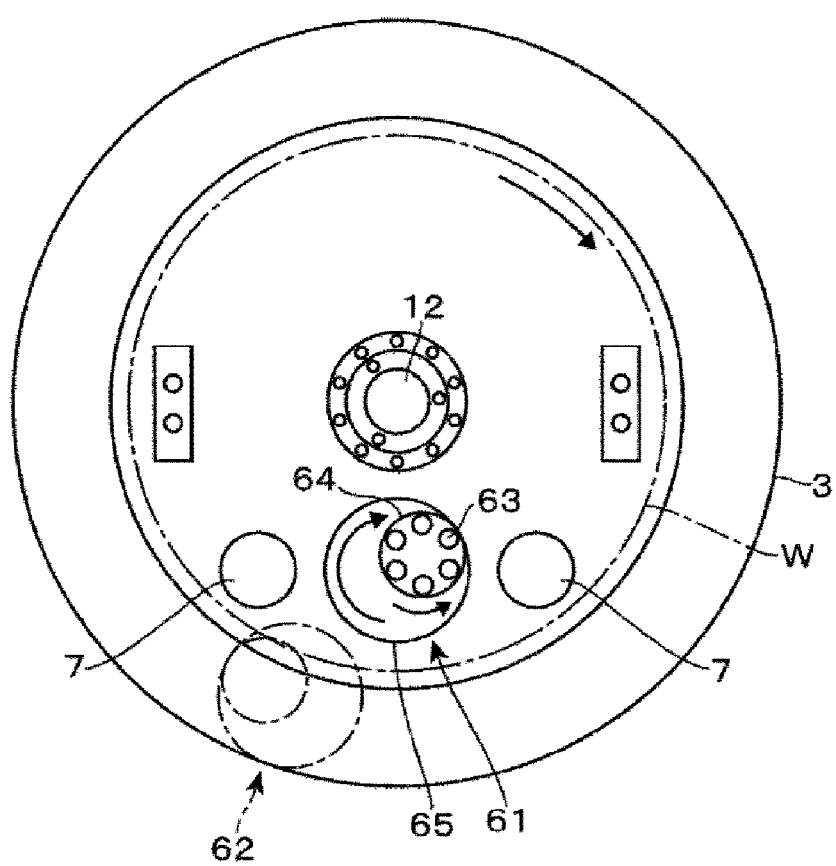
FIG. 10 is a plan view of the polishing apparatus for showing a wafer processing process.
Figure 11:
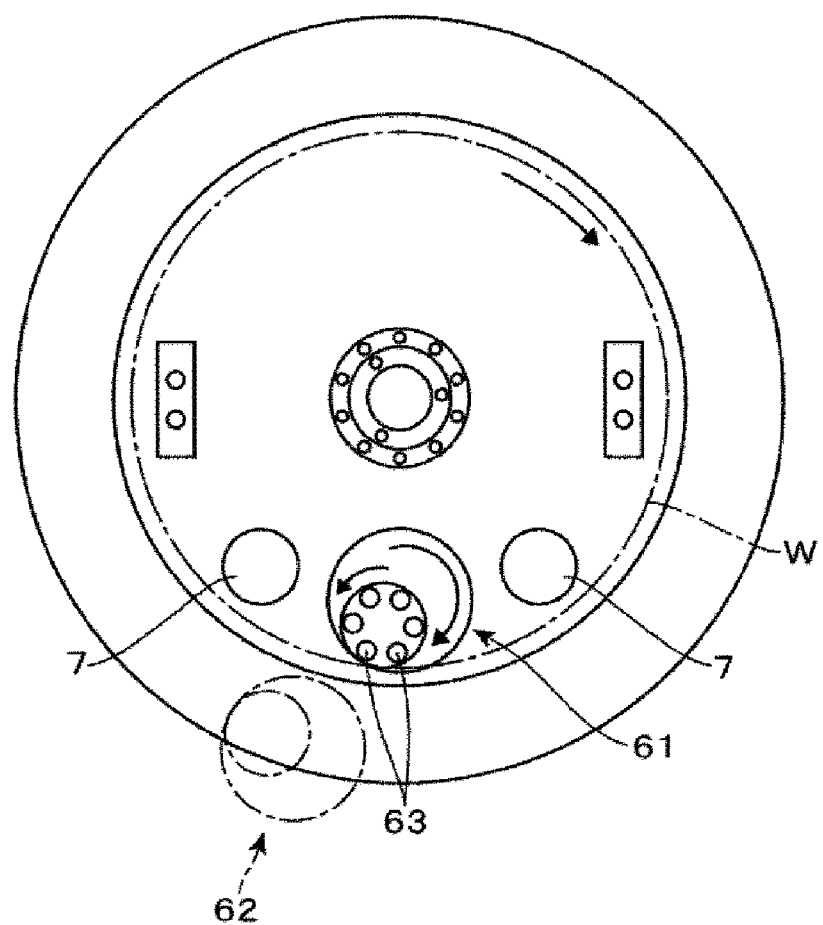
FIG. 11 is a plan view of the polishing apparatus for showing a wafer processing process.
Figure 12:
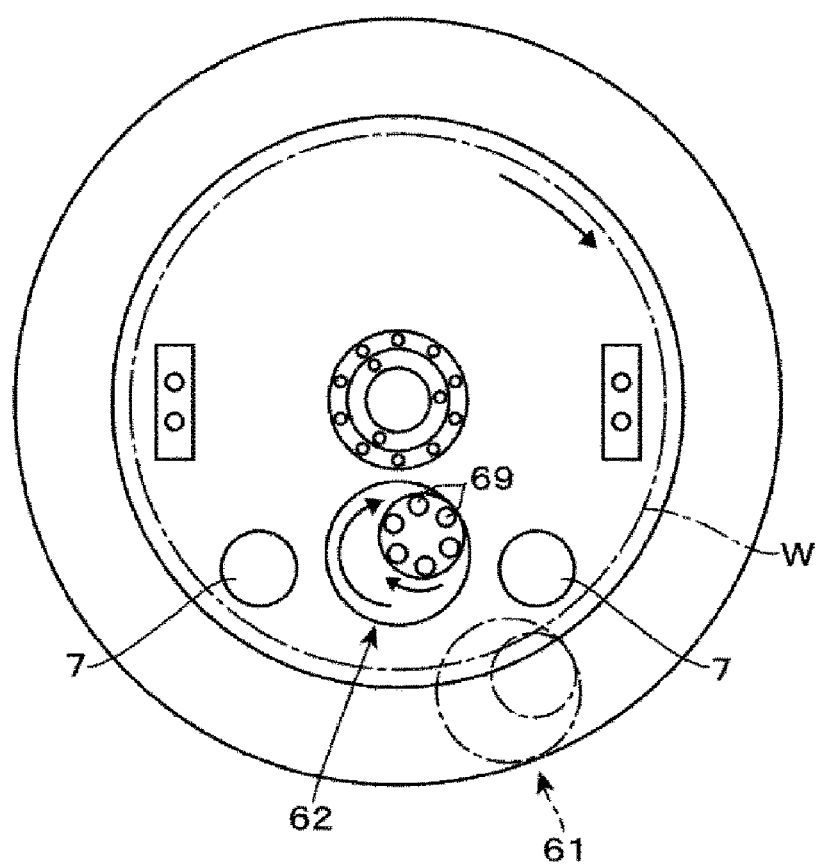
FIG. 12 is a plan view of the polishing apparatus for showing a wafer processing process.
Figure 13:
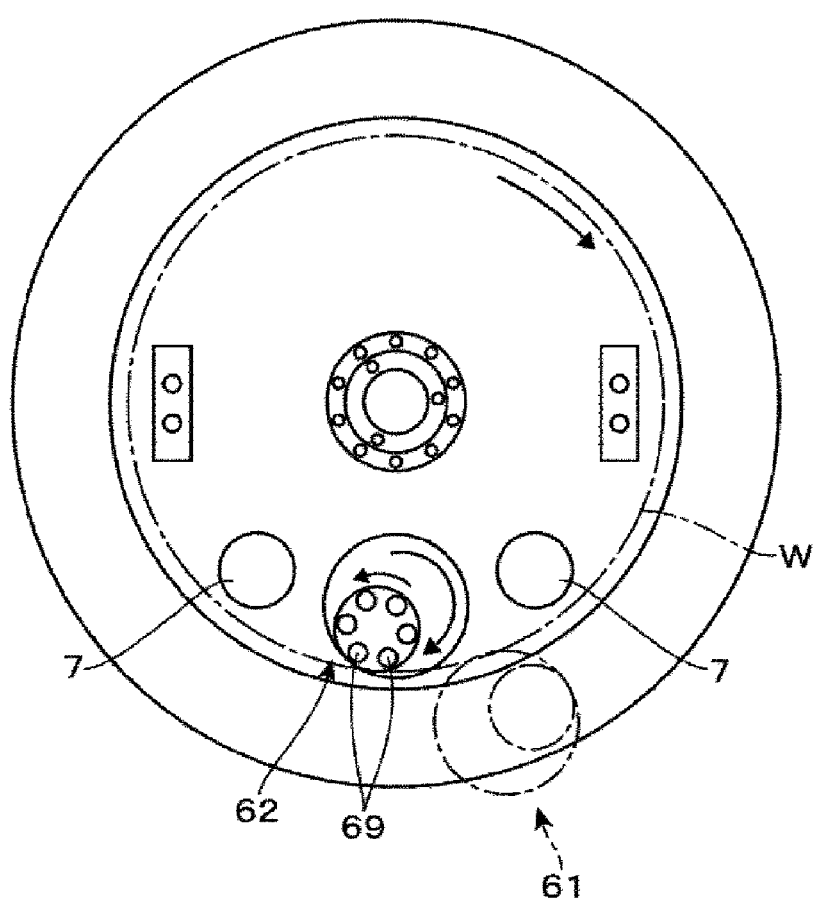
FIG. 13 is a plan view of the polishing apparatus for showing a wafer processing process.

Subsequently, as described with reference to FIG. 9, the brushes 69 instead of the grindstones 63 are pressed against the back surface of the wafer W. The support plate 64 of the cleaning mechanism 62 is rotated and revolved, whereby the central portion of the back surface of the wafer W is rubbed and cleaned by the brushes 69. The central portion of the front surface of the wafer W is continuously pressed by the pressing member 225. Thereafter, the supply of the pure water 240 from the pressing part main body 226 and the front surface cleaning nozzle 232 is temporarily stopped, and the wafer W is delivered from the fixed chuck 35 to the spin chuck 12. During this delivery, the pressing member 225 is retracted from the front surface of the wafer W.

Thereafter, the grindstones 63 of the polishing mechanism 61 are pressed against the region adjacent to the central portion of the back surface of the wafer W which has already been polished and cleaned. The pressing member 225 positioned so that the center thereof overlaps with, for example, the revolution axis P2 of the polishing mechanism 61 is moved downward. The pressing member 225 faces the grindstones 63 and presses the wafer W interposed between the grindstones 63 and the pressing member 225. Then, the pure water 240 is supplied to the pressing member 225 and the pure water 240 is discharged from the front surface cleaning nozzle 232. Meanwhile, the support plate 64 of the polishing mechanism 61 is rotated and revolved and the wafer W is rotated by the spin chuck 12, whereby polishing is performed (see FIG. 32).

Figure 35:
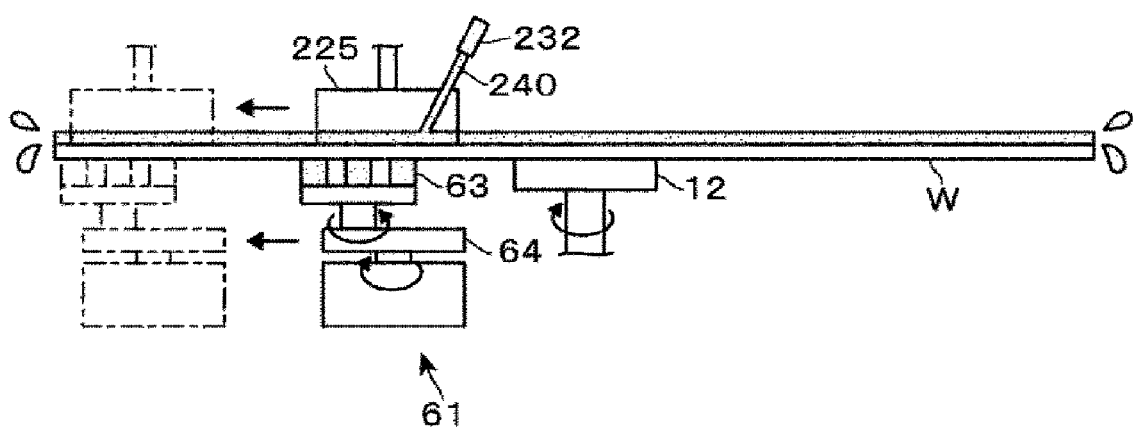
FIG. 35 is a side view showing the operation of the polishing apparatus.
Figure 36:
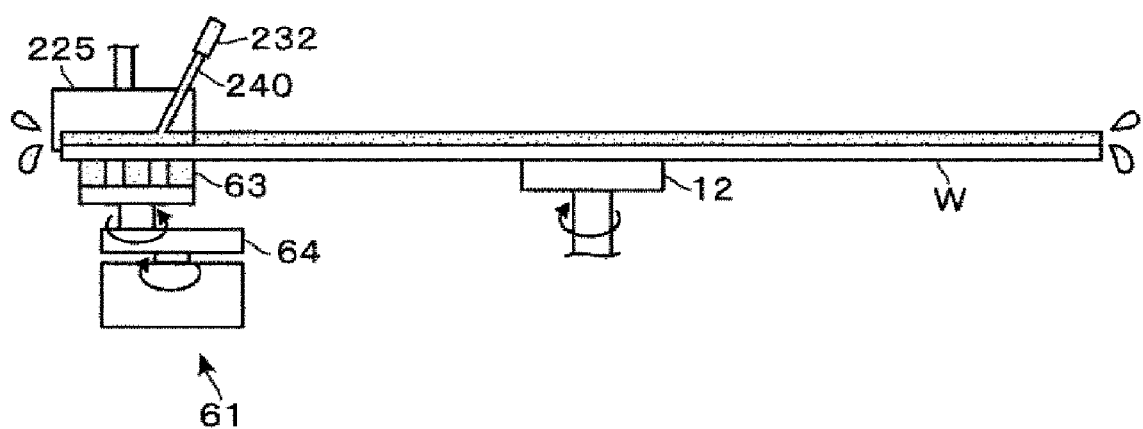
FIG. 36 is a side view showing the operation of the polishing apparatus.

Thereafter, for example, the polishing mechanism 61 and the pressing member 225 are linearly moved backward so as to face the peripheral portion of the wafer W while maintaining the mutual positional relationship between the revolution center of the support plate 64 and the pressing member 225 (see FIG. 35). Then, when the end of the grindstones 63 nearest to the outer side of the wafer W is located slightly inside the peripheral edge of the wafer W, the backward movement of the polishing mechanism 61 is stopped. In other words, as viewed from above, the backward movement of the polishing mechanism 61 is stopped at a position where the grindstones 63 do not protrude from the wafer W. The pressing member 225 continues to move backward. When the rear end portion of the pressing member 225 is located outside the wafer W, the backward movement of the pressing member 225 is stopped (see FIGS. 33 and 36). Even when a part of the pressing member 225 is positioned outside the wafer W as described above, the pressing member 225 presses the region through which the grindstones 63 pass as viewed in a plan view.

As described above, the pores are formed on the entire pressing surface 230 constituting the pressing member 225 and the pure water 240 is supplied from the entire pressing surface 230. Therefore, if pressing member 225 is moved so that the end portion thereof is positioned outside the wafer W as described above, some of the pores for supplying the pure water 240 are located outside the wafer W. The pure water 240 is supplied from the pores located outside the wafer W to the side surface of the wafer W. The portion of the pressing member 225 located outside the wafer W protrudes downward of the wafer W due to the restoring force of the pressing member 225 and makes contact with the side surface of the wafer W. By supplying the cleaning solution and bringing the pressing member 225 into contact with the side surface of the wafer W in this manner, the side surface of the wafer W is cleaned. The side surface of the wafer W described here includes not only a vertical surface but also a slant surface extending downward and outward from the front surface of the wafer W, namely a so-called bevel surface. By stopping the backward movement of the polishing mechanism 61 at the above-described position, it is possible to prevent the polishing mechanism 61 from polishing the pressing member 225 protruding toward the lateral side of the wafer W as described above.

Thereafter, the grindstones 63 and the pressing member 225 are separated from the wafer W. The supply of the pure water 240 to the front surface of the wafer W and the rotation of the wafer W are temporarily stopped, whereby the polishing process is completed. Thereafter, the cleaning mechanism 62 performs the same operation as the polishing mechanism 61, and the rotation of the wafer W is restarted to clean the outer region of the central portion of the back surface of the wafer W. When the cleaning is performed in this manner, the pressing member 225 performs the same operation as the operation of polishing the outer region of the central portion of the back surface of the wafer W described with reference to FIGS. 32, 33, 35, and 36. In other words, the processing is performed by controlling the operations of the brushes 69 of the cleaning mechanism 62 and the pressing member 225 so that the positional relationship thereof becomes the same as the positional relationship between the grindstones 63 and the pressing member 225 during the polishing process. Furthermore, pure water is supplied to the front surface of the wafer W by the pressing member 225 and the front surface cleaning nozzle 232. After the completion of the cleaning process for the outer region of the central portion of the back surface of the wafer W, the brushes 69 of the cleaning mechanism 62 and the pressing member 225 are separated from the wafer W. The discharge of the pure water from the pressing member 225 and the front surface cleaning nozzle 232 is stopped. The pure water 240 is shaken off from the wafer W by the rotation of the wafer W, whereby the processing by the polishing apparatus 201 is completed.

According to the polishing apparatus 201, by disposing the pressing member 225 as described above, the pressing member 225 is positioned on the revolution trajectory of the support plate 64 of the polishing mechanism 61 both when polishing the central portion of the back surface of the wafer W and when polishing the outer region of the central portion of the back surface of the wafer W. More specifically, when viewed in a plan view, the pressing member 225 presses a region that overlaps with a region where the grindstones 63 are moved by the revolution and rotation of the support plate 64. Accordingly, the deformation of the wafer W due to the pressing of the grindstones 63 is suppressed, and the shape of the wafer W is kept horizontal, whereby the back surface of the wafer W is reliably brought into close contact with the grindstones 63 and polished by the grindstones 63. Even in the case of performing the cleaning process, the pressing member 225 is arranged similarly to the case of polishing. Thus, the pressing member 225 is disposed on the revolution trajectory of the support plate 64 of the cleaning mechanism 62 to press the wafer W. The pressing member 225 presses a region overlapping with a region where the brushes 69 move as viewed in a plan view, whereby the back surface of the wafer W is reliably brought into close contact with the brushes 69 and rubbed by the brushes 69.

Incidentally, the pure water supply pipe 228 may not be connected to the pressing part main body 226 of the pressing member 225. When the wafer W is pressed by the pressing member 225, the pure water supplied to the front surface of the wafer W from the front surface cleaning nozzle 232 may be absorbed from the front surface of the wafer W and held by the pressing part main body 226 so as to perform the cleaning of the wafer W. In order to allow the pressing part main body 226 to absorb the pure water from the front surface of the wafer W as described above, for example, as shown in FIG. 27, the above-described liquid landing position P3 is preferably set in the vicinity of the pressure member 225 at the upstream side in the rotational direction of the wafer W. In addition, the front surface of the wafer W may be cleaned only by the pressing member 225 without providing the front surface cleaning nozzle 232.

The forward/backward moving mechanism 224 may not be provided in the pressing mechanism 211, and the processing may be performed without moving the pressing member 225 back and forth. For example, when polishing and cleaning the central portion of the back surface of the wafer W, the pressing member 225 is disposed at the position indicated by a solid line in FIG. 27, and the wafer W is held by the fixed chuck 35 so that the central portion of the back surface of the wafer W is pressed against the pressing member 225. Even when polishing and cleaning the outer region of the central portion of the back surface of the wafer W, the pressing member 225 is disposed at the position indicated by the solid line in FIG. 27 so that the peripheral portion of the wafer W is pressed. In other words, when polishing and cleaning the outer region of the central portion of the back surface of the wafer W, the processing may be performed so as not to move the pressing member 225 along with the movement of the polishing mechanism 61 and the cleaning mechanism 62 described with reference to FIGS. 32 and 35. In order to properly suppress the deformation of the wafer W, the size of the pressing member 225 is appropriately adjusted.

Figure 37:
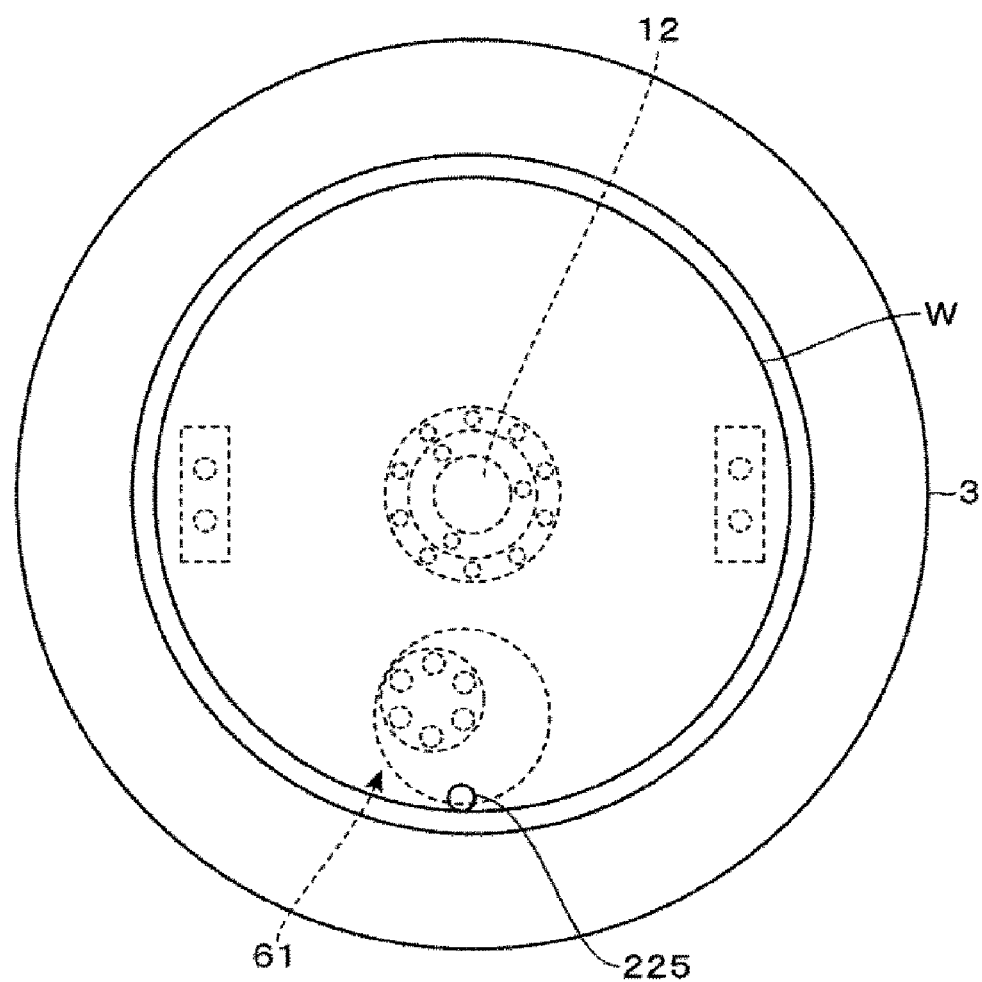
FIG. 37 is a plan view showing another configuration of the pressing member.

In the processing examples shown in FIGS. 31 to 36, the pressing member 225 is not moved in the horizontal direction when pressing the central portion of the wafer W. However, even when pressing the central portion of the wafer W, the pressing member 225 may be moved in the horizontal direction. Incidentally, the diameter L1 (see FIG. 27) of the pressing member 225 is not limited to the above example. The diameter L1 of the pressing member 225 shown in FIG. 37 is 10 mm. For example, a mechanism configured similarly to the polishing mechanism 61 and configured to revolve and rotate the support plate 64 for supporting the pressing member 225 may be provided on the arm 221 of the pressing mechanism 211, and the pressing member 225 having a relatively small diameter as shown in FIG. 37 may be provided on the support plate 64. Then, the pressing member 225 may be moved so that one of the grindstones 63 and the pressing member 225 overlap with each other, revolve at the same speed and move in the same trajectory. In other words, during the polishing process, the processing may be performed so that one of the grindstones 63 and the pressing member 225 always face each other across the wafer W.

Figure 38:
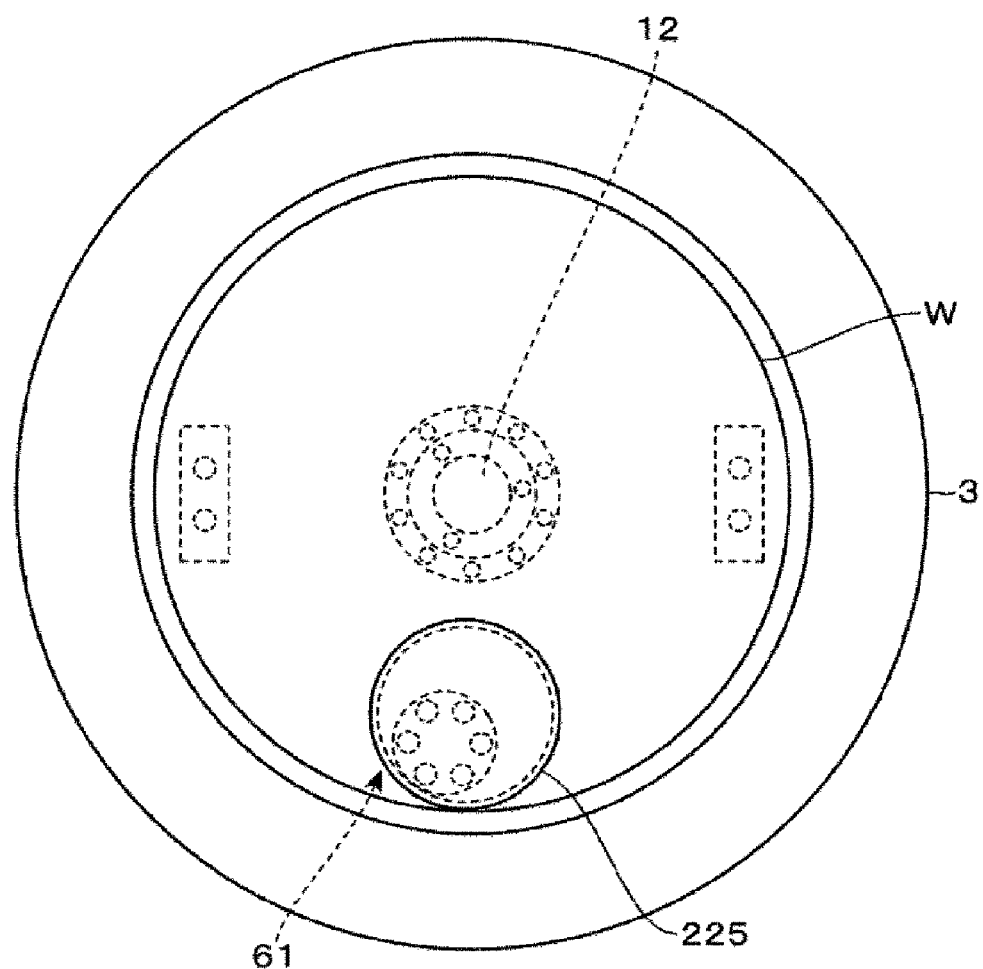
FIG. 38 is a plan view showing another configuration of the pressing member.
Figure 39:
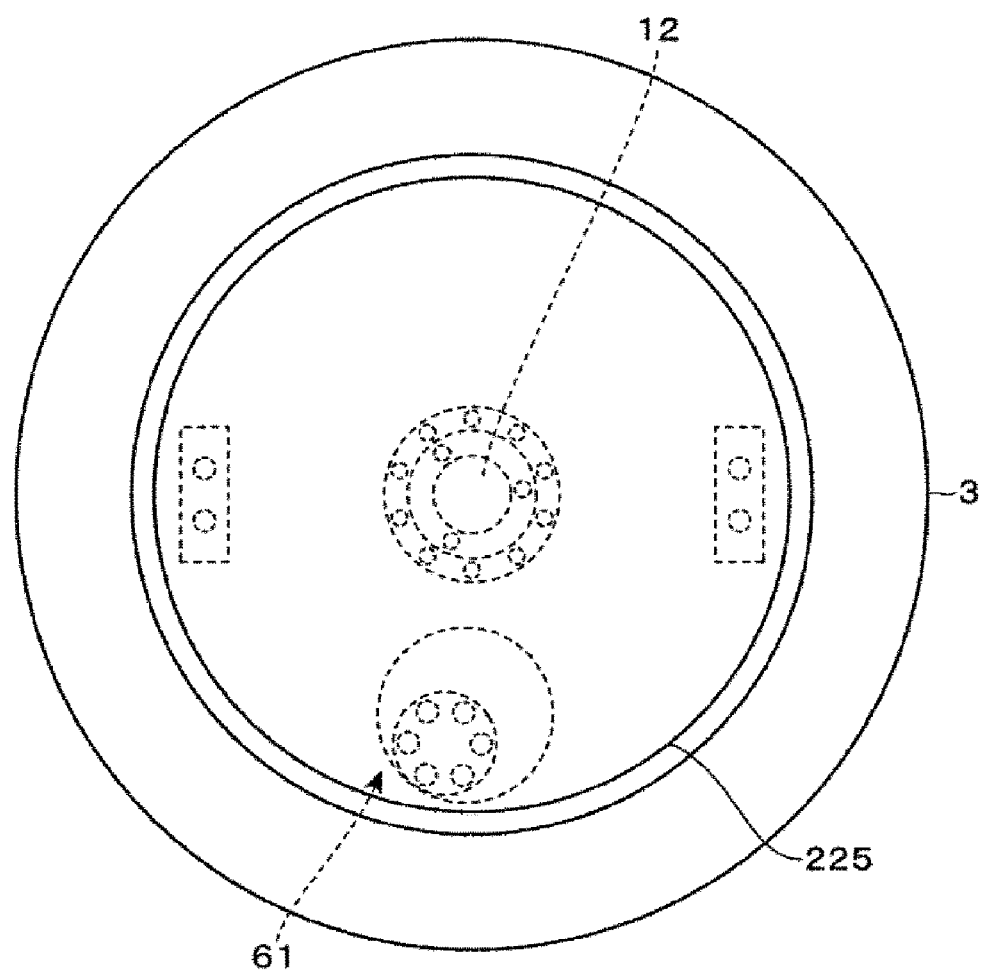
FIG. 39 is a plan view showing another configuration of the pressing member.

FIG. 38 shows an example in which the diameter L1 of the pressing member 225 is 80 mm which is slightly larger than that of the example shown in FIG. 27. FIG. 39 shows an example in which the diameter L1 of the pressing member 225 is 300 mm which is the same as the diameter of the wafer W. In other words, the pressing member 225 of FIG. 39 covers the entire front surface of the wafer W. In the case where the pressing member 225 has the size as shown in FIG. 39, both when polishing and cleaning the central portion of the wafer W and when polishing and cleaning the outer region of the central portion of the wafer W, the pressing member 225 presses the wafer W by being disposed so that the center of the pressing member 225 overlaps with the center of the wafer W. Therefore, the pressing member 225 is not necessarily configured to move in the horizontal direction during the processing on the wafer W.

If the diameter L1 of the pressing member 225 is too small, the wafer W may not be sufficiently pressed. If the diameter L1 is larger than the diameter of the wafer W, the pressing member 225 has an unnecessarily large size. Therefore, it is preferable that the diameter of the pressing member 225, namely the diameter L1 of the pressing surface 230 of the pressing member 225 is 10 mm to 300 mm. Furthermore, as described with reference to FIGS. 31 to 36, if the processing is performed by moving the pressing member 225 in the horizontal direction along with the movement of the polishing mechanism 61, it is possible to set the diameter L1 to a relatively small value, for example, 10 mm to 100 mm. Such a size is preferable because it is possible to reduce the space in which the pressing member 225 waits in the polishing apparatus 201. In addition, when moving the pressing member 225 in the horizontal direction as described above, the pressing member 225 is moved along a straight line by the forward/backward moving mechanism 224 in the above-mentioned example. However, it is only necessary to maintain a state in which the region where the grindstones 63 or the brushes 69 are moved by the revolution and rotation of the support plate 64 during the horizontal movement and the region pressed by the pressing member 225 overlap with each other. Accordingly, the pressing member 225 may be moved along a curve by the rotating mechanism 222.

Furthermore, the pressing by the pressing member 225 is not necessarily performed in all time zones within the period during which the grindstones 63 makes contact with the wafer W to perform the polishing. In other words, the pressing member 225 may face the grindstones 63 across the wafer W to press the wafer W only when the grindstones 63 are located at a predetermined position. With respect to the brushes 69, the pressing by the pressing member 225 may be performed only when the brushes 69 are positioned at a predetermined position. The peripheral portion of the wafer W is more easily deformable than the central portion of the wafer W when receiving a load. Therefore, it is preferable that the pressing by the pressing member 225 is performed at least when the grindstones 63 and the brushes 69 are positioned in the peripheral portion of the wafer W.

It is only necessary that the pressing member 225 faces the grindstones 63 or the brushes 69 across the wafer W when the grindstones 63 or the brushes 69 move while pressing the back surface of the wafer W upward. In other words, it is only necessary that as viewed in a plan view, the pressing member 225 overlaps with the grindstones 63 and the brushes 69. Accordingly, the pressing member 225 is not limited to being circular but may be square. In addition, the pressing member 225 is not limited to being made of, for example, a porous material or an elastic material as long as it can press the wafer W as described above. However, in order to prevent damage to the wafer W and to perform the cleaning as described above, it is preferable that the pressing member is made of a porous material or an elastic material. Moreover, the cleaning solution supplied from the front surface cleaning nozzle 232 and the pressing member 225 is not limited to pure water but may be, for example, an organic solvent unless it affects the film formed on the front surface of the wafer W. It should be noted that the respective embodiments described above may be combined with each other or may be appropriately modified.

According to the present disclosure, there is provided a revolution mechanism for causing a sliding member, which rotates about a vertical axis, to revolve around a vertical revolution axis so as to have a revolution radius smaller than the diameter of the sliding member. When the outer side of the central portion of the back surface of a substrate is held, the central portion of the back surface of the substrate is slidingly processed by the sliding member. When the central portion of the back surface of the substrate is held, the peripheral portion of the back surface of the rotating substrate is slidingly processed by the sliding member. As a result, it is possible to process the central portion and the peripheral portion of the back surface of the substrate with high uniformity. In addition, when the sliding member repeatedly slides on the respective in-plane portions of the substrate, the sliding member can be caused to slide toward mutually different directions. Thus, the sliding action of the sliding member is reliably applied to the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a first holding part configured to horizontally hold a region not overlapping with a central portion of a back surface of a substrate;
a second holding part configured to horizontally hold the central portion of the back surface of the substrate and to rotate the substrate about a vertical axis;
a sliding member configured to rotate about a vertical axis so that the sliding member slides on the back surface of the substrate to perform processing;
a revolution mechanism configured to revolve the sliding member under rotation about a vertical revolution axis so as to have a revolution radius smaller than a diameter of the sliding member; and
a relative movement mechanism configured to horizontally move a relative position between the substrate and a revolution trajectory of the sliding member so that when the substrate is held by the first holding part, the sliding member slides on the central portion of the back surface of the substrate, and when the substrate is held by the second holding part, the sliding member slides on a peripheral portion of the back surface of the substrate under rotation.

2. The apparatus of claim 1, further comprising a height regulating part configured to regulate a height of the peripheral portion of the substrate by performing suction of the peripheral portion of the substrate or supply of a fluid to the peripheral portion when the substrate is held by the second holding part.

3. The apparatus of claim 2, wherein the height regulating part is configured to perform suction with respect to left and right regions of the sliding member when the sliding member is viewed from a center of the substrate under rotation or to perform supply of the fluid with respect to the left and right regions.

4. The apparatus of claim 2, wherein when the substrate is held by the second holding part, the revolution trajectory of the sliding member is located at a first position near the central portion of the substrate and a second position near the peripheral portion of the substrate, and
a suction pressure in the height regulating part or a flow rate of the fluid supplied to the substrate is larger when the revolution trajectory is located at the second position than when the revolution trajectory is located at the first position.

5. The apparatus of claim 2, further comprising a control part configured to acquire information on a warp of the substrate as an acquired information and to output a control signal so that a suction pressure in the height regulating part or a flow rate of the fluid supplied to the substrate is adjusted based on the acquired information.

6. The apparatus of claim 1, wherein when the substrate is held by the first holding part, the revolution of the sliding member is performed so that the revolution axis overlaps with a center of the substrate.

7. The apparatus of claim 1, wherein when the substrate is held by the second holding part, a value obtained by dividing a larger one of a rotation speed of the substrate and a revolution speed of the sliding member by a smaller one thereof is a value other than an integer.

8. The apparatus of claim 1, wherein the sliding member is configured by a polishing member for polishing and roughening the back surface of the substrate.

9. The apparatus of claim 8, further comprising:
a cleaning member configured to rotate about a vertical axis so as to rub and clean a region roughened by the polishing member; and
a cleaning part revolving mechanism configured to revolve the cleaning member under rotation about a vertical revolution axis,
wherein the cleaning member is configured to rub the central portion of the substrate when the substrate is held by the first holding part, and the cleaning member is configured to rub the peripheral portion of the substrate when the substrate is held by the second holding part.

10. The apparatus of claim 1, further comprising: a pressing mechanism configured to press the substrate from a front surface side of the substrate toward a back surface side thereof so as to suppress deformation of the substrate when the sliding member slides on the substrate.

11. The apparatus of claim 10, wherein the pressing mechanism includes a pressing member having a pressing surface configured to press the substrate by facing the sliding member across the substrate, and an elevating mechanism configured to raise and lower the pressing member.

12. The apparatus of claim 11, wherein a cleaning solution discharge hole configured to supply a cleaning solution for cleaning the substrate is provided on the pressing surface, and the pressing surface is configured to press a front surface of the substrate supplied with the cleaning solution.

13. The apparatus of claim 12, wherein the pressing mechanism includes a horizontal movement mechanism configured to, when the revolution trajectory of the sliding member moves between a central portion side of the substrate and a peripheral portion side of the substrate, move the pressing member between the central portion side of the substrate and the peripheral portion side of the substrate to maintain a state in which the sliding member and the pressing member face each other across the substrate.

14. The apparatus of claim 13, wherein the pressing surface is made of a porous material having elasticity.

15. The apparatus of claim 14, wherein the cleaning solution discharge hole provided on the pressing surface is a pore of the porous material, and
the horizontal movement mechanism is configured to move the pressing member pressing the substrate, so that a part of the pressing surface is located outside the substrate so as to clean a side surface of the substrate.

16. The apparatus of claim 11, wherein the pressing surface is circular, and the diameter of the pressing surface is 10 mm to 100 mm.

17. A substrate processing method, comprising:
horizontally holding, by a first holding part, a region not overlapping with a central portion of a back surface of a substrate;
horizontally holding, by a second holding part, the central portion of the back surface of the substrate and rotating the substrate about a vertical axis;
rotating a sliding member, which is configured to perform processing by sliding on the back surface of the substrate, about a vertical axis;
revolving, by a revolution mechanism, the sliding member under rotation around a vertical revolution axis so as to have a revolution radius smaller than a diameter of the sliding member;
horizontally moving, by a relative movement mechanism, a relative position between the substrate and a revolution trajectory of the sliding member;
revolving the sliding member under rotation so as to slide on the central portion of the back surface of the substrate when the substrate is held by the first holding part; and
revolving the sliding member so as to slide on a peripheral portion of the back surface of the substrate when the substrate is held by the second holding part.

* * * * *